US010446607B2

(12) United States Patent
Yi et al.

(10) Patent No.: US 10,446,607 B2
(45) Date of Patent: Oct. 15, 2019

(54) INTEGRATED TWO-TERMINAL DEVICE WITH LOGIC DEVICE FOR EMBEDDED APPLICATION

(71) Applicant: GLOBALFOUNDRIES Singapore Pte. Ltd., Singapore (SG)

(72) Inventors: Wanbing Yi, Singapore (SG); Curtis Chun-I Hsieh, Singapore (SG); Juan Boon Tan, Singapore (SG); Soh Yun Siah, Singapore (SG); Hai Cong, Singapore (SG); Alex See, Singapore (SG); Young Seon You, Singapore (SG); Danny Pak-Chum Shum, Singapore (SG); Hyunwoo Yang, Singapore (SG)

(73) Assignee: GLOBALFOUNDARIES SINGAPORE PTE. LTD., Singapore (SG)

( * ) Notice: Subject to any disclaimer, the term of this patent is extended or adjusted under 35 U.S.C. 154(b) by 275 days.

(21) Appl. No.: 15/393,200

(22) Filed: Dec. 28, 2016

(65) Prior Publication Data
US 2018/0182810 A1 Jun. 28, 2018

(51) Int. Cl.
*H01L 27/22* (2006.01)
*H01L 43/08* (2006.01)
*H01L 43/12* (2006.01)

(52) U.S. Cl.
CPC .......... *H01L 27/224* (2013.01); *H01L 27/228* (2013.01); *H01L 43/08* (2013.01); *H01L 43/12* (2013.01)

(58) Field of Classification Search
CPC ......... H01L 43/12; H01L 43/08; H01L 43/02; H01L 27/222; H01L 43/10; H01L 27/228
See application file for complete search history.

(56) References Cited

U.S. PATENT DOCUMENTS 9,362,171 B2    6/2016  Gong et al.
2002/0109172 A1  8/2002  Okazawa
(Continued)

OTHER PUBLICATIONS

Xu et al., A Breakthrough in Low-k Barrier/Etch Stops Films for Copper Damascene Applications, Mar. 2000, Semiconductor Fabtech—11th Edition, pp. 239-244.
(Continued)

*Primary Examiner* — Yu-Hsi D Sun
(74) *Attorney, Agent, or Firm* — Thompson Hine LLP

(57) ABSTRACT

Devices and methods of forming a device are disclosed. The method includes providing a substrate and a first upper dielectric layer over first and second regions of the substrate. The first upper dielectric layer includes a first upper interconnect level with a plurality of metal lines in the regions. A two-terminal device element which includes a device layer coupled in between first and second terminals is formed over the first upper dielectric layer in the second region. The first terminal contacts the metal line in the first upper interconnect level of the second region and the second terminal is formed on the device layer. An encapsulation liner covers at least exposed side surfaces of the device layer of the two-terminal device element. A dielectric layer which includes a second upper interconnect level with dual damascene interconnects is provided in the regions. The dual damascene interconnect in the first region is coupled to the metal line in the first region and the dual damascene interconnect in the second region is coupled to the two-terminal device element.

14 Claims, 18 Drawing Sheets

(56) References Cited

U.S. PATENT DOCUMENTS

| | | |
|---|---|---|
| 2002/0173139 A1 | 11/2002 | Kweon |
| 2003/0002330 A1 | 1/2003 | Nishimura |
| 2004/0191928 A1 | 9/2004 | Shi |
| 2005/0242382 A1 | 11/2005 | Daughton et al. |
| 2010/0181633 A1* | 7/2010 | Nam ..................... B82Y 25/00 257/421 |
| 2010/0184239 A1 | 7/2010 | Matsuzaki |
| 2010/0193850 A1* | 8/2010 | Asao ..................... H01L 27/228 257/295 |
| 2011/0084314 A1 | 4/2011 | Or-Bach et al. |
| 2012/0007214 A1 | 1/2012 | Chu et al. |
| 2012/0135543 A1 | 5/2012 | Shin et al. |
| 2012/0314494 A1 | 12/2012 | Shuto |
| 2014/0264679 A1 | 9/2014 | Lee et al. |
| 2016/0071905 A1 | 3/2016 | Park |

OTHER PUBLICATIONS

Davis et al. "Chapter 8: Predictive Process Design Kits", 2011, Springer, Y. Cao, Predictive Technology Model for Robust Nanoelectronic Design, Integrated Circuit and Systems.

* cited by examiner

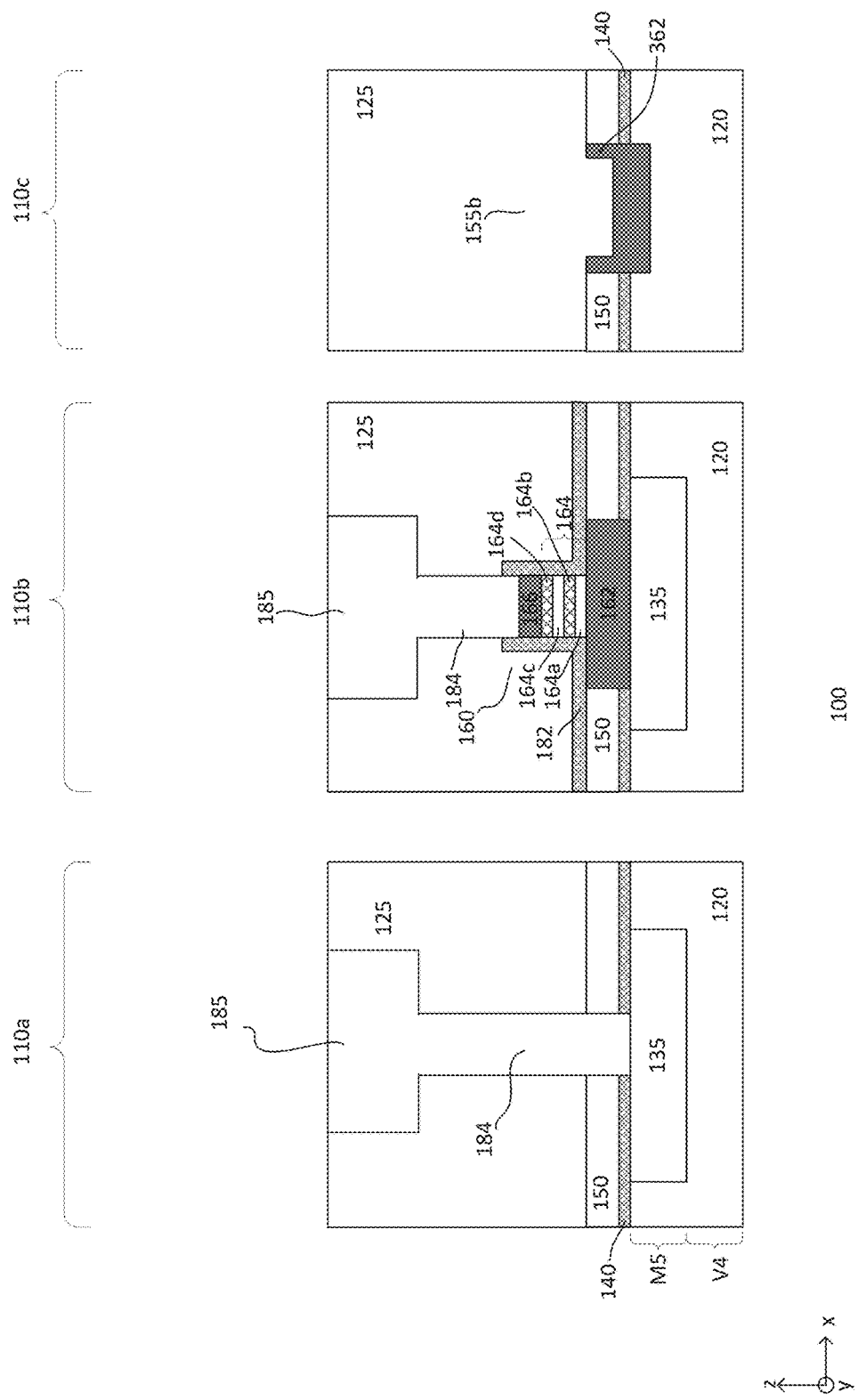

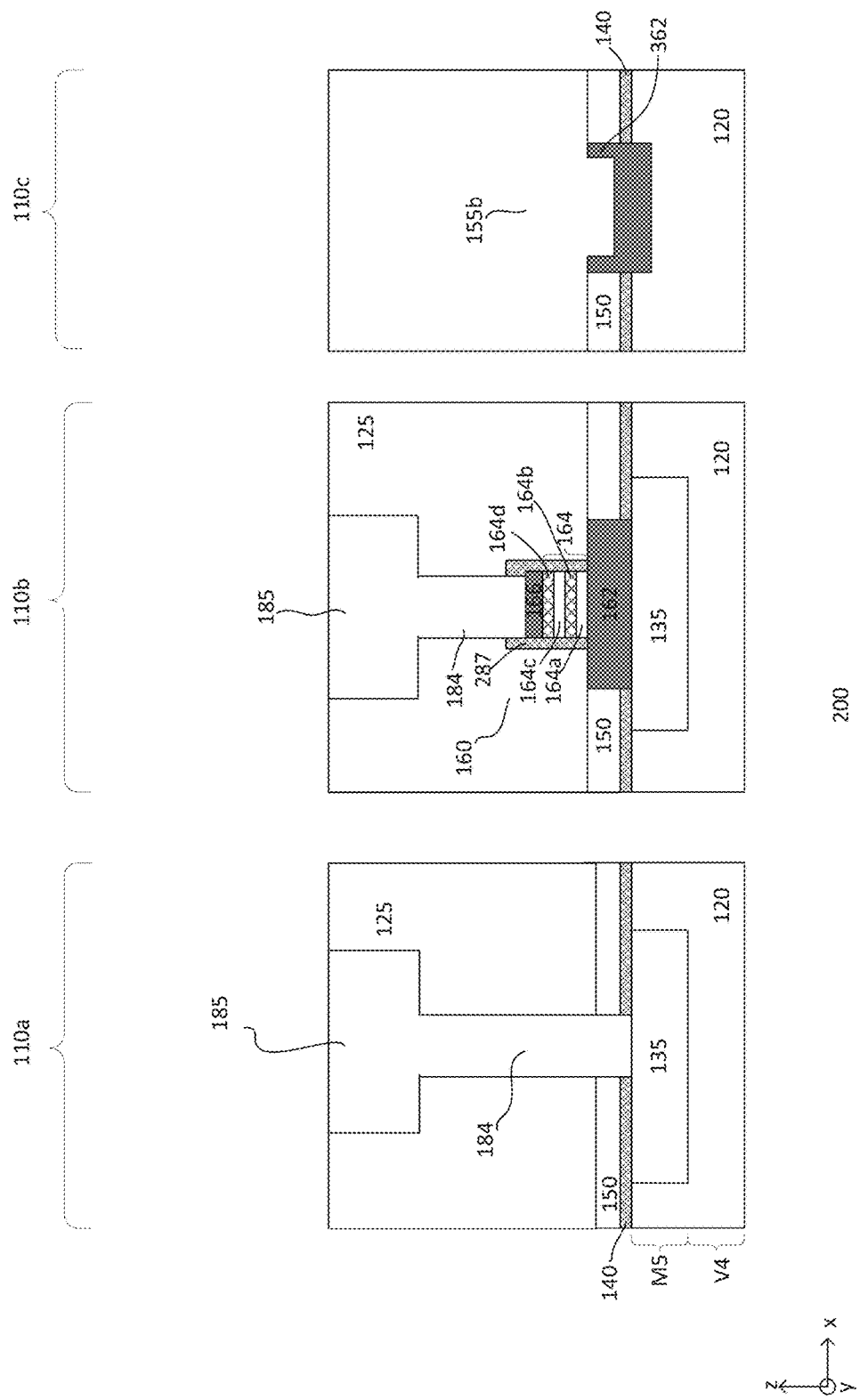

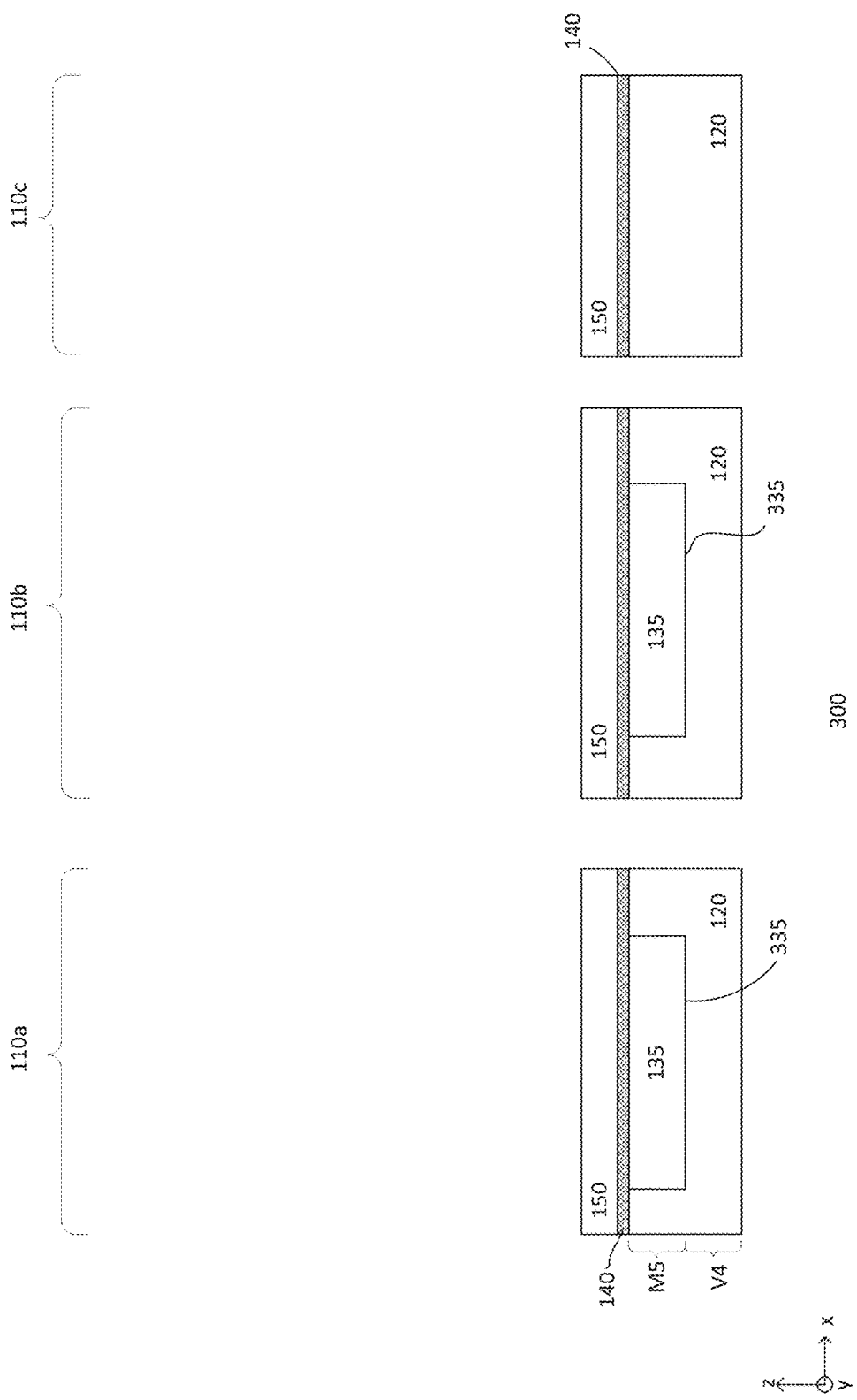

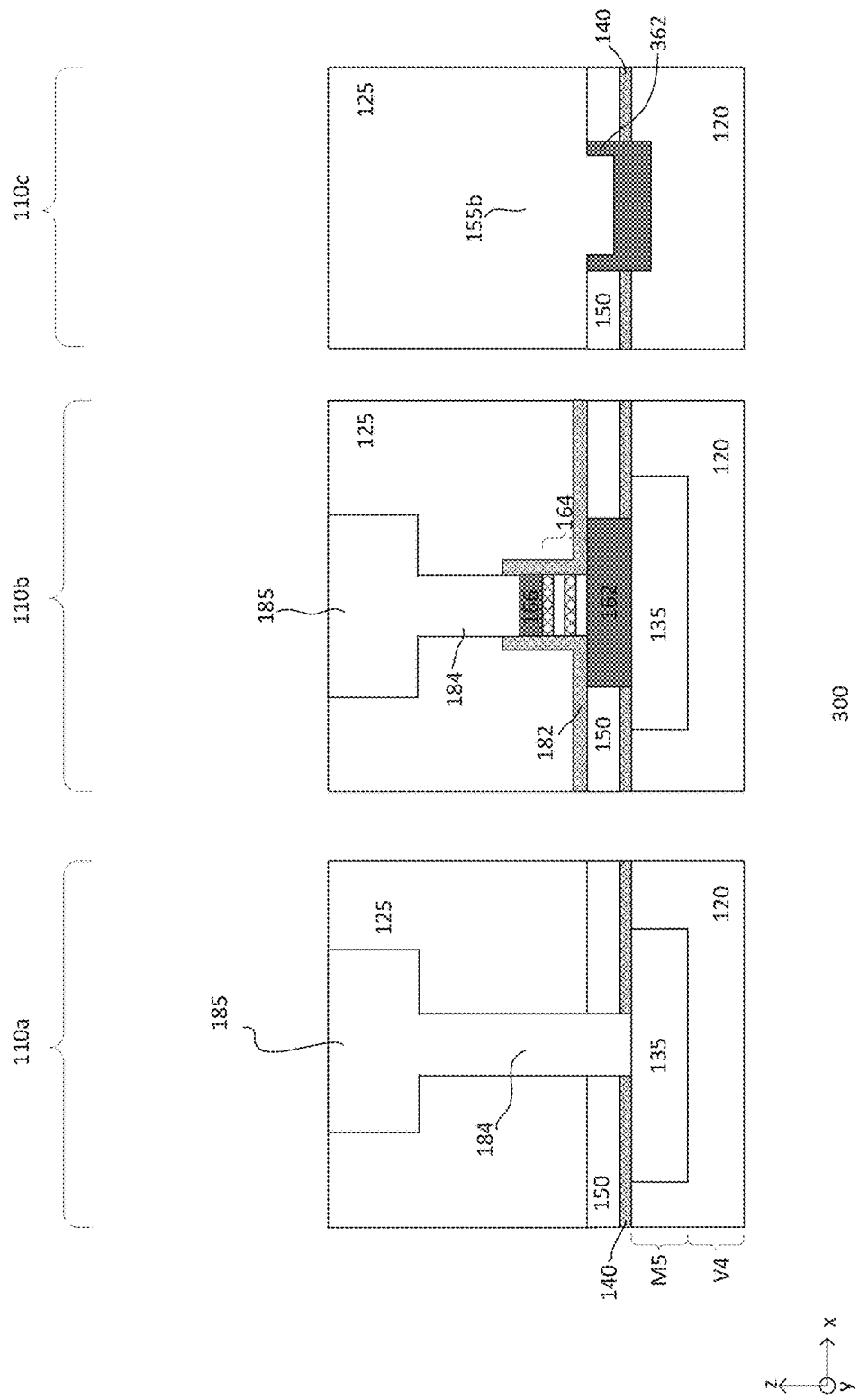

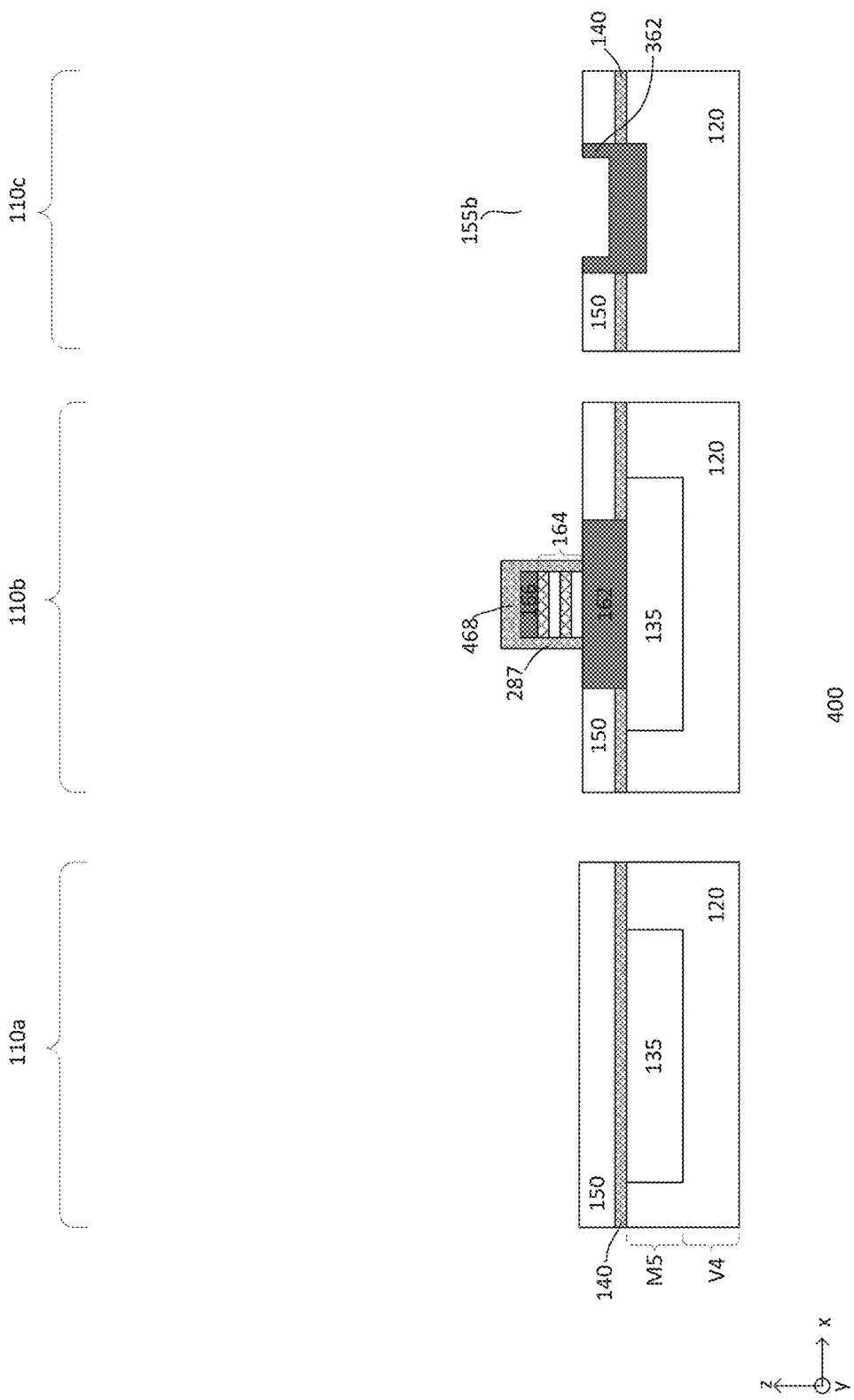

INTEGRATED TWO-TERMINAL DEVICE WITH LOGIC DEVICE FOR EMBEDDED APPLICATION

CROSS-REFERENCE TO RELATED APPLICATION

This application cross-references to co-pending U.S. patent application Ser. No. 15/063,544, filed on Mar. 8, 2016 which claims the priority benefit of U.S. Provisional Application Ser. No. 62/132,463, filed on Mar. 12, 2015, the disclosures of which are hereby incorporated by reference in their entireties for all purposes.

BACKGROUND

As technology evolves into era of sub-micron, there is a desire to integrate various two-terminal device elements such as but not limited to memory elements with high speed logic circuit elements into a single chip or integrated circuit (IC) to form an embedded memory. An example of the two-terminal device element is a magnetic random access memory (MRAM) element which gains popularity in recent years. MRAM, for example, includes magnetic tunnel junction (MTJ) stack layers sandwiched between top and bottom electrodes or terminals. The MTJ stack layers are generally connected to interconnects in the interlevel dielectric (ILD) layer. Nevertheless, it is difficult to integrate the two-terminal device element with logic circuit element in a single chip since each of these elements has different requirements. For example, it is necessary to alter or change the logic processing steps to accommodate for the two-terminal device element. This undesirably complicates the manufacturing process and increases the manufacturing cost. Moreover, during integration, the reliabilities of the two-terminal elements such as memory elements may degrade due to process limitations which cause electrical shorts between the terminals of the two-terminal elements or between one of the terminal to the device layer of the two-terminal device elements.

Accordingly, it is desirable that the process of manufacturing two-terminal device element to be highly compatible with logic processing and it is also desirable to integrate the two-terminal device elements with logic devices into a single chip or IC in a reliable, simplified and cost effective way.

SUMMARY

Embodiments of the present disclosure generally relate to semiconductor devices and methods for forming a semiconductor device. In one aspect, a method of forming a device is disclosed. The method includes providing a substrate defined with at least first and second regions. A first upper dielectric layer is provided over the first and second regions of the substrate. The first upper dielectric layer includes a first upper interconnect level with a plurality of metal lines in the first and second regions. A two-terminal device element is formed in the second region. The two-terminal device element includes a device layer coupled in between first and second terminals over the first upper dielectric layer. The first terminal is in direct contact with the metal line in the first upper interconnect level of the second region and the second terminal is formed on a top surface of the device layer. An encapsulation liner is formed to cover at least exposed side surfaces of the device layer of the two-terminal device element. A dielectric layer is provided over the first and second regions and covers the first upper dielectric layer. The dielectric layer includes a second upper interconnect level with dual damascene interconnects in the first and second regions, where a dual damascene interconnect includes a metal line and a via contact. The dual damascene interconnect in the first region is formed over and is coupled to the metal line in the first region and the dual damascene interconnect in the second region is coupled to the two-terminal device element.

In another aspect, a device is presented. The device includes a substrate defined with at least first and second regions. A first upper dielectric layer is disposed over the first and second regions of the substrate. The first upper dielectric layer includes a first upper interconnect level with a plurality of metal lines in the first and second regions. A two-terminal device element is disposed in the second region. The two-terminal device element includes a device layer coupled in between first and second terminals over the first upper dielectric layer. The first terminal is in direct contact with the metal line in the first upper interconnect level of the second region and the second terminal is disposed on a top surface of the device layer. An encapsulation liner is disposed to cover at least exposed side surfaces of the device layer of the two-terminal device element. A dielectric layer is disposed over the first and second regions and covers the first upper dielectric layer. The dielectric layer includes a second upper interconnect level with dual damascene interconnects in the first and second regions, where a dual damascene interconnect includes a metal line and a via contact. The dual damascene interconnect in the first region is disposed over and is coupled to the metal line in the first region and the dual damascene interconnect in the second region is coupled to the two-terminal device element.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 1a shows cross-sectional views of logic and memory regions of an embodiment of a device and FIG. 1b shows enlarged cross-sectional views of logic and memory portions and scribe region of the device;

FIG. 2a shows cross-sectional views of logic and memory regions of another embodiment of a device and FIG. 2b shows enlarged cross-sectional views of logic and memory portions and scribe region of the device;

FIGS. 3a-3i show cross-sectional views of an embodiment of a process for forming a device;

FIGS. 4a-4e show cross-sectional views of another embodiment of a process for forming a device.

DETAILED DESCRIPTION

Embodiments of the present disclosure generally relate to cost effective and reliable integration of two-terminal device element with logic device in an integrated circuit (IC). The two-terminal device element includes first and second terminals and a device layer in between and coupled to the first and second terminals. By way of an example as well as for illustration purpose, the two-terminal device element as presented in this disclosure includes a memory or storage element of a spin transfer torque magnetic random access memory (STT-MRAM) device. The memory device includes storage element of a memory cell having MTJ stack layers sandwiched between top and bottom electrodes. In such case, the MTJ stack layers may correspond to the device layer while the top and bottom electrodes may correspond to the top and bottom terminals of the two-terminal device element which provide conducting path for the device element. Depending on the memory type, the electrodes may have additional requirement. For example, the bottom electrode surface roughness needs to be good for MRAM.

Embodiments of the present disclosure as will be described later allows reliable insertion of the MTJ stack layers and top/bottom electrode in between two adjacent metal levels with via height of the logic component larger than the total height of the MTJ stack layers and top/bottom electrode. It is understood that embodiments of the present disclosure are also applicable to other suitable types of memory element such as resistive random access memory (RRAM) or other suitable types of two-terminal device elements. Such memory device together with logic components are generally based on any suitable technology node (including but not limited to 28 nm technology node). The memory device together with the logic components can be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1A:
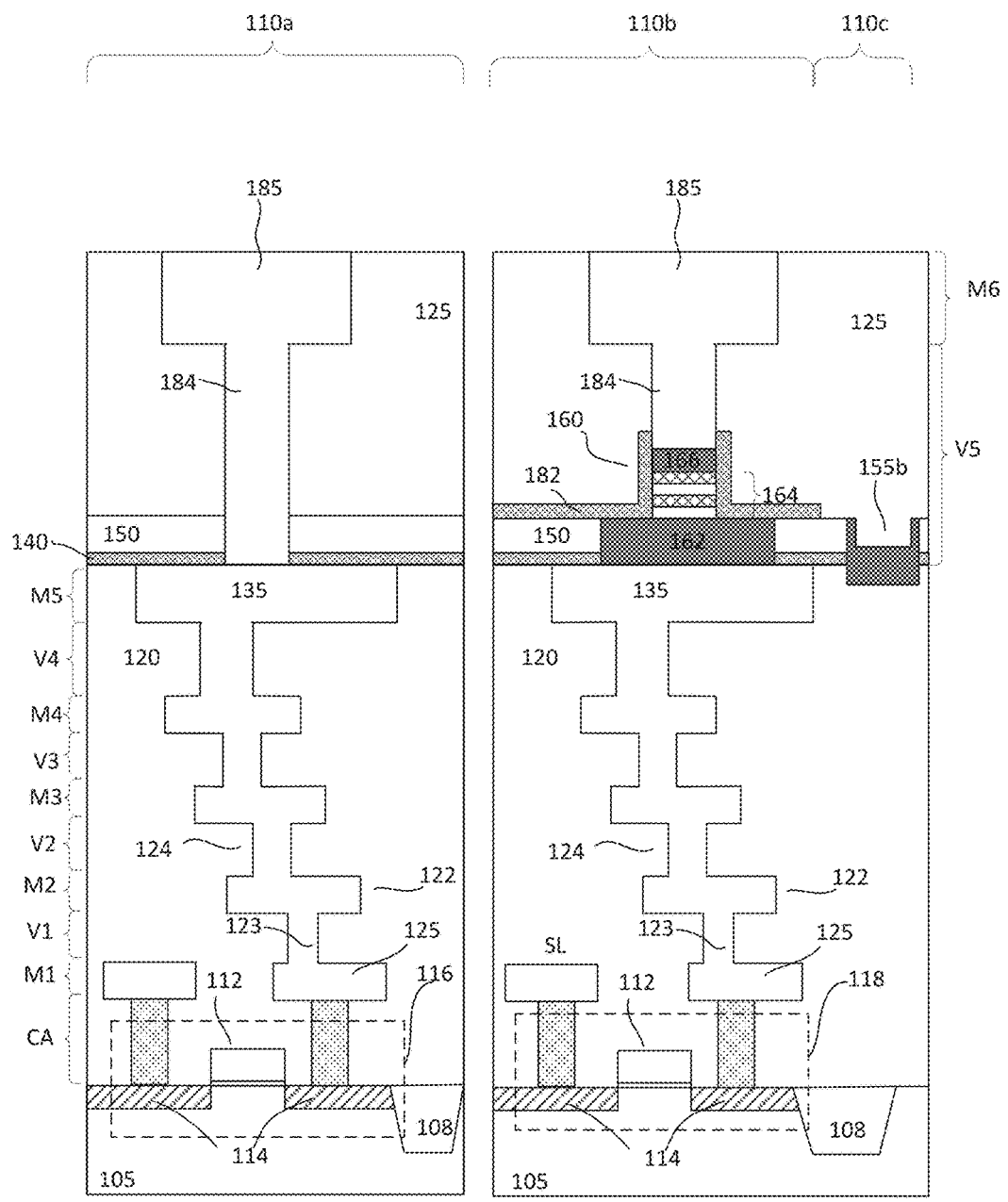

FIG. 1a shows cross-sectional views of first region 110a, second region 110b and third region 110c of an embodiment of a device 100. FIG. 1b shows enlarged cross-sectional views of upper ILD level of the first, second and third regions of the device 100. The first region 110a may be referred to as the logic region, the second region 110b may be referred to as the memory region and the third region 110c may be referred to as the scribe lane/region or dicing channel. The cross-sectional view, for example, is along a bitline (or x) direction of the device. The device 100, as shown, includes a memory cell having a cell selector unit or transistor and one or more logic transistors. The memory cell, for example, may be a non-volatile memory (NVM) cell. The memory cell, in one embodiment, is a magnetoresistive NVM cell, such as a STT-MRAM cell.

The cell select unit of the memory cell and the logic transistor of the logic component are disposed on a substrate 105. For example, the logic transistor 116 is disposed in the first (or logic) region 110a and the memory cell selector unit 118 is disposed in the second (or memory) region 110b of the same substrate. The second region 110b is a memory cell region which may be part of an array region. For example, the array region may include a plurality of cell regions. The substrate may also include other types of device regions (not shown).

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors in the logic region 110a, the memory cell region 110b as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a logic region 110a and a memory cell region 110b isolated by isolation regions 108, such as shallow trench isolation (STI) regions. The memory cell region is for a memory cell. Isolation regions may be provided to isolate columns of memory cells. Other configurations of isolation regions may also be useful. The first region 110a may include a logic device well (not shown) while the second region 110b may include a cell device well (not shown). The cell device well, for example, serves as a body well for a cell select transistor 118 of the memory cell while the logic device well, for example, serves as a body well for the logic transistor. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

As shown, the first region includes a logic transistor 116 while the second region includes a cell selector unit 118. The cell selector unit includes a selector for selecting the memory cell. The selector, for example, may be a select transistor. In one embodiment, the select and logic transistors are metal oxide semiconductor (MOS) transistors. Thus, the FEOL processing forms the logic transistor in the first region and the cell selector transistor in the second region. The transistors, as shown, include first and second source/drain (S/D) regions 114 formed in the substrate and a gate 112 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline (or y) direction. The gate conductor forms a common gate for a row of cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the logic transistor in the first region and cell selector unit in the second region and other transistors (not shown) in other device regions, back end of line (BEOL) processing is performed. The BEOL process includes forming interconnects in interlevel dielectric (ILD) layers. The interconnects connect the various components of the IC to perform the desired functions. An ILD level includes a metal level 122 and a contact level 124. Generally, the metal level includes conductors or metal lines while the contact level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (ME) may also be employed to form metal lines.

A device may include a plurality of ILD layers or levels. For example, x number of ILD levels may be provided. As illustrated, the device includes 6 ILD levels (x=6). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as ME, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is formed of a low-k dielectric material. Preferably, the first ILD layer is an ultra low-k dielectric layer, such as SiCOH. Other suitable types of low-k dielectric materials may also be useful. The dielectric layer may be formed by CVD. Other suitable techniques for forming the first ILD layer may also be useful.

Conductive lines 125 are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional or upper ILD layers/levels. The additional ILD levels may include ILD level 2 to ILD level x. For example, in the case where x=6 (6 levels), the upper ILD level includes ILD levels from 2 to 6, which includes via levels V1 to V5 and metal levels M2 to M6. Designating other ILD levels as upper ILD level may also be useful. The number of ILD levels may depend on, for example, design requirements or the logic process involved. The ILD layers, in one embodiment, are formed of low-k dielectric materials. Preferably, the ILD layers of ILD levels 2 to 6 include ultra low-k dielectric layers, such as SiCOH. Other suitable types of low-k dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be NBLoK. Other types of dielectric materials for the dielectric liner may also be useful.

The uppermost ILD level (e.g., M6) may have different design rules, such as critical dimension (CD), than the lower ILD levels. For example, Mx may have a larger CD than metal levels M1 to Mx−1 below. For example, the uppermost metal level may have a CD which is 2× the CD of the metal levels below.

As shown, S/D contacts are disposed in the CA level. The S/D contacts are coupled to the first and second S/D regions of the transistors in the first and second regions. Other S/D contacts coupled to other S/D regions of transistors may also be provided. The CA level may include a gate contact (not shown) coupled to the gate of the transistor. The gate contact may be disposed in another cross-section of the device. The gate contact is coupled to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. As an example, a source line (SL) is coupled to the second S/D region of the select transistor. As for the first S/D contact, it may be coupled to a contact pad or island in M1. The contact pad provides connections to upper ILD levels. The metal lines or pads may be formed of copper or copper alloy. Other types of conductive material may also be useful.

As for the additional or upper ILD levels, for example, from 2 to 6, they include contacts 123 in the via level 124 and contact pads/metal lines 125 in the metal level 122. The contacts and contact pads provide connection from M6 to the first S/D region of the transistors in the first and second regions.

As shown in FIG. 1a, the first region 110a accommodates a logic component and the second region 110b accommodates a MRAM cell. The MRAM cell includes a storage or memory element which is generally disposed in between adjacent final metal levels of upper ILD level in the second region 110b of the device. In one example, the storage element is formed in between adjacent upper ILD levels, such as upper ILD level 5 to 6. It is understood that the storage element of the MRAM cell may be disposed in between any suitable adjacent ILD levels. For illustration purpose, the enlarged cross-sectional views of the logic and memory portions of the device shown in FIG. 1b show a dielectric layer 120 which corresponds to upper ILD level 5. The upper ILD level 5, for example, includes a via level and a metal level. The upper ILD level 5, for example, includes via level V4 and metal level M5. One or more via contacts (not shown) may be disposed in V4 in the first and second regions 110a-110b.

For the sake of simplicity, the dielectric layer 120 in this disclosure may be referred to as a first upper dielectric layer and its via and metal levels may be referred to as a first upper interconnect level. As shown in the first and second regions, metal lines 135 are disposed in the metal level (e.g., M5) of the first upper dielectric layer 120. The metal line 135, for example, may be referred to as a lower interconnect of the upper ILD levels in the first and second regions. The metal line 135 in the first region may be coupled to first S/D region of the logic transistor 116 disposed on the substrate. The metal line 135 in the second region, for example, is coupled to a MTJ element of the MRAM cell which will be described later. The metal line 135 in the second region, for example, may be used for connection purpose and couples the MTJ element to first S/D region of the select transistor 118. Although one metal line is shown in each of the first and second regions, it is understood that there could be other suitable number of metal lines in the same metal level of the first and second regions.

The metal lines 135 include a conductive material. The conductive material, for example, includes copper (Cu). Other suitable types of conductive material may also be useful. The dimensions of this metal line 135 and its underlying via contact, for example, are defined at the minimum line resolution of the lithography and etch capability for a technology process node, which may be referred to as 1× design rule. The thickness of the metal lines 135 with reference to the top surface of the first upper dielectric layer 120, for example, is about 850-1000 Å. Other suitable thickness dimensions may also be useful, depending on the design requirements of a technology node.

A dielectric liner 140 is disposed above the first upper dielectric layer 120 in the first, second and third regions 110a-110c and covering the metal lines 135 in the first and second regions. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second upper dielectric layer 150 is disposed on the first upper dielectric layer 120. For example, the second upper dielectric layer is disposed on the dielectric liner 140. The second upper dielectric layer, in one embodiment, includes a low-k dielectric material. For example, the low-k dielectric material includes a low-k dielectric layer, such as SiCOH. Other suitable dielectric materials and thicknesses for the second upper dielectric layer may also be useful.

The second upper dielectric layer 150, in one embodiment, includes trenches in the second and third regions 110b-110c. The trench in the second region, for example, accommodates a bottom electrode of a storage element of the MRAM cell as will be described later while the trench 155b is an alignment trench that is disposed in the scribe region or scribe lane 110c adjacent to the memory region. The trench in the second region, for example, extends from the top surface of the second upper dielectric layer to the top surface of the metal line 135 while the alignment trench 155b extends from the top surface of the second upper dielectric layer 150 and extends partially into the first upper dielectric layer 120. During processing, the alignment trench 155b, for example, provides topographic feature which is used to align subsequently deposited memory or magnetic stack layers and subsequent formed layers of the storage element of the MRAM cell. The topographic feature is also used as an alignment mark for patterning the magnetic stack layers such that the patterned layers are aligned and coupled to the underlying bottom electrode which will be described in FIGS. 3a-3i later.

In the second region 110b, a storage element 160 of the MRAM cell is disposed over the second upper dielectric layer. In one embodiment, the MRAM cell is a STT-MRAM cell and the storage element includes a magnetic tunnel junction (MTJ) element. Other suitable types of storage elements or memory cells may also be useful.

The storage element includes first and second electrodes. The first electrode, for example, may be a bottom electrode 162 while the second electrode may be a top electrode 166. The bottom electrode 162 of the memory element is disposed in the trench and is connected to the metal line 135. The bottom electrode 162, in one embodiment, extends through the second upper dielectric layer 150 and dielectric liner 140 and is directly coupled to the metal line 135 in the second region. As for the third region 110c, the alignment trench 155b is partially filled with a bottom electrode material 362 which includes a topographic feature to serve as an alignment mark for patterning the MTJ stack of the storage element later.

The storage element includes a MTJ stack 164 disposed in between the top and bottom electrodes. The storage element, for example, may include a bottom-pinned MTJ element or a top-pinned MTJ element. The bottom-pinned MTJ element is formed by having the magnetically fixed layer disposed below the magnetically free layer while the top pinned MTJ element is formed by having the fixed layer disposed above the free layer. For illustration purpose, the MTJ stack includes four layers. It is understood that the MTJ stack may include other suitable number of layers. The MTJ stack generally includes a magnetically fixed (pinned) layer 164a, one or more tunneling barrier layers 164b and 164d and a magnetically free layer 164c. The fixed layer includes a magnetic layer and a pinning layer. The pinning layer, for example, pins the magnetization direction of the magnetic layer, forming a pinned layer.

By way of example, the free layer and the fixed layer may be CoFeB or CoFe based composite material and the tunneling barrier layer may be MgO or $Al_2O_3$. As for the pinning layer, it may be PtMn or IrMn. The top and bottom electrodes may be Ti, TiN, Ta, TaN or other suitable metals used in the semiconductor process. Other suitable configurations or materials of storage or memory element may also be useful.

The top electrode 166 and layers of the MTJ stack 164 of the memory cell, for example, may have sidewalls that are aligned with each other and include a length dimension which is smaller than a length dimension of the bottom electrode 162. In other embodiments which are not shown herein, the top electrode and upper layers of the MTJ stack of the memory cell may have a length dimension which is smaller than a length dimension of the lower layers of the MTJ stack and bottom electrode. Other suitable configurations for the top electrode and MTJ stack may also be useful.

In one embodiment, an encapsulation liner 182 may line exposed top surface of the second upper dielectric layer 150 in the second region. The encapsulation liner 182, as shown, also lines exposed surfaces of the bottom electrode 162, side surfaces of the MTJ stack 164 and side surfaces of the top electrode 166 in the second region, as shown in FIG. 1b. Thus, the encapsulation liner 182 may be provided with horizontal portions (e.g., extend along the x-direction) which line exposed surfaces of the second upper dielectric layer and bottom electrode and vertical portion (e.g., extend along the z-direction) which surrounds side surfaces of the MTJ stack and top electrode. The encapsulation liner 182 may be a low k dielectric liner. For example, the low k dielectric liner may be NBLoK or SiN. Other suitable types of dielectric materials for the encapsulation liner may also be useful.

A third upper dielectric layer 125 is disposed over the second upper dielectric layer 150. The dielectric layer 125, for example, covers the storage element in the second region and the alignment trench 155b in the third region. The dielectric layer 125 and the second upper dielectric layer 150, for example, corresponds to upper ILD level 6. The dielectric layer 125 includes low-k dielectric material. Preferably, the third upper dielectric layer includes a low-k dielectric layer, such as SiCOH. Other suitable configurations and materials for the dielectric layer may also be useful.

The dielectric layer 125 includes a dual damascene interconnect structures in the first and second regions. For example, the dielectric layer 125 includes a via contact 184 which couples a metal line 185 or upper interconnect to the lower interconnect 135 in the logic region 110a while the dielectric layer 125 accommodates the storage element and includes a via contact 184 which couples metal line 185 or upper interconnect to the storage element of the memory cell in the memory region 110b. The metal lines 185 are disposed in the metal level while the via contacts are disposed in the via level of the dielectric layer 125. For simplicity, the via and metal levels of the dielectric layer 125 may be referred to as a second upper interconnect level. For example, the metal lines 185 may be disposed in metal level M6 while the via contacts 184 and the storage element may be disposed in via level V5. The metal line 185 in the second region, for example, may serve as a bitline (BL). Providing the bitline at other metal level may also be useful. Although one metal line is shown for each first and second regions in metal level M6, it is understood that there could be other suitable number of metal lines in the same metal level of the first and second regions.

The via contacts 184, for example, may be referred to as the top via contact and the metal lines 185, for example, may be referred to as the top metal line. The dimensions of the metal lines 185 and the via contacts 184, for example, may be defined at twice the minimum line resolution of the lithography and etch capability for a technology process node, which may be referred to as 2× design rule. For example, the thickness of the top metal lines 185, for example, may be at least 2 times greater than the thickness of the metal lines 135 below. The top via contact 184, as shown in FIG. 1b, couples the metal line 185 in upper metal level to the metal line 135 in lower metal level. The top via contact 184 in the first region, for example, extends through the second upper dielectric layer 150 and dielectric liner 140 while the top via contact 184 in the second region, for example, extends to the top surface of the top electrode 166. As shown, the via contact 184 in the second region includes a height which is smaller than the height of the via contact 184 in the first region. The top via contact and top metal line include a conductive material, such as Cu. Other suitable configurations and conductive materials for the via contact and metal lines may also be useful.

In one embodiment, the via contact 184 in the second region may include a width dimension which takes into consideration the critical dimension (CD) of the top CD of the MTJ stack and thickness of vertical portions of the dielectric liner 182 surrounding the side surfaces of the MTJ stack so that the via contact is fully landed on top of the MTJ stack as shown in FIGS. 1a-1b. For example, the bottom CD of the via contact in the second region may be the same or smaller than top CD of the MTJ stack. In one embodiment, a top surface of vertical portion of the encapsulation liner 182 which surrounds side surfaces of the MTJ stack extends beyond a bottom of the via contact 184 in the second region to cater for the CD and overlay variation and to ensure a full landing process.

A pad level (not shown) is disposed over the uppermost ILD level. For example, a pad dielectric level is disposed over Mx. In the case where the device includes 6 metal levels, the pad level is disposed over M6. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

Figure 2A:
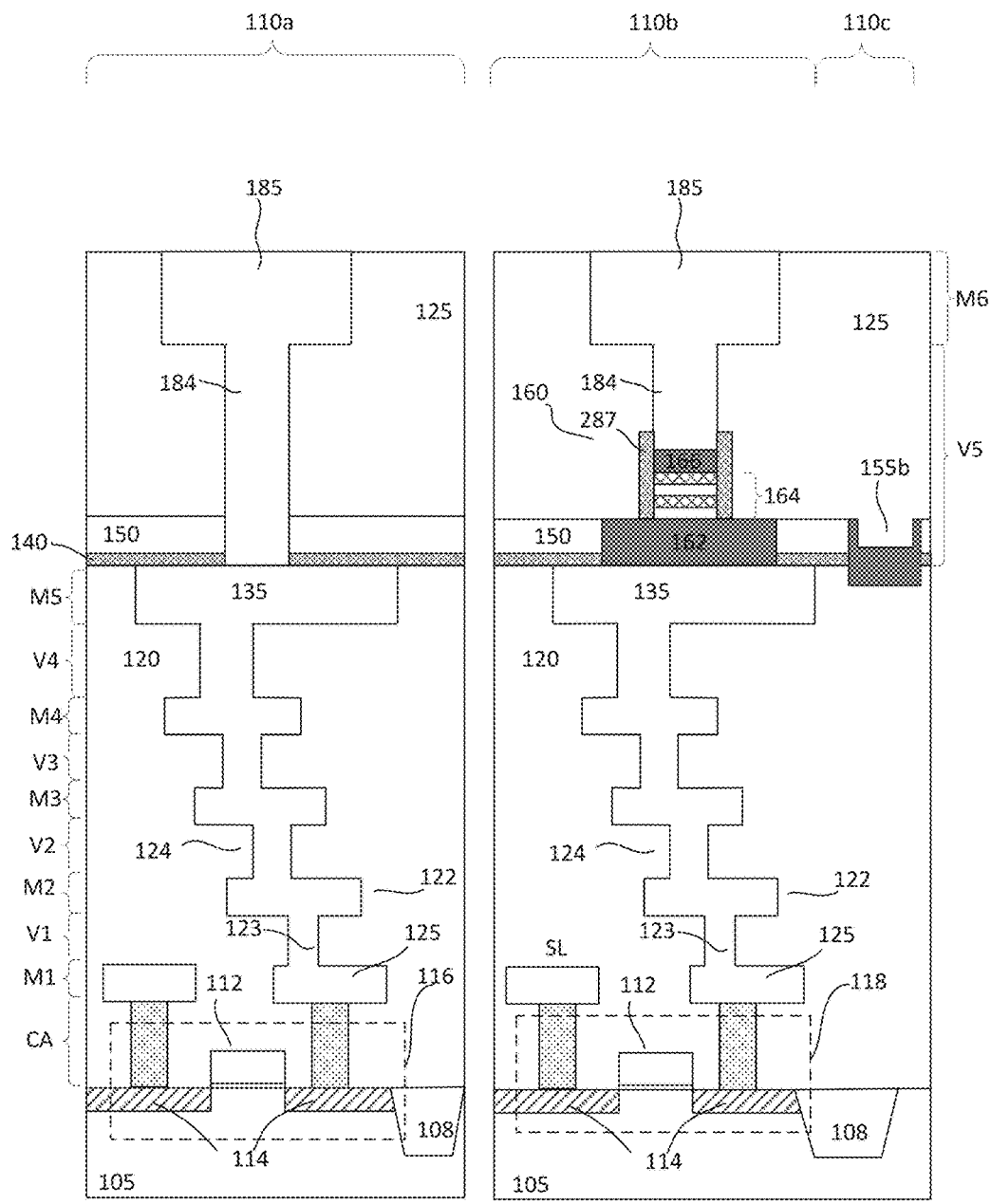

FIG. 2a shows cross-sectional views of first (or logic) region 110a, second (or memory) region 110b and third (or scribe) region 110c of another embodiment of a device 200. FIG. 2b shows enlarged cross-sectional views of upper ILD level of the first, second and third regions of the device 200. The device 200, for example, is similar to the device 100 as described in FIGS. 1a-1b. Common elements and features having the same reference numerals may not be described or described in detail. In the interest of brevity, the description of the device 200 below primarily focuses on the difference(s) compared with the device 100 shown in FIGS. 1a-1b.

As shown in FIGS. 2a-2b, the device 200 includes a storage element having MTJ stack 164 disposed in between the first and second electrodes. The first electrode, for example, may be the bottom electrode 162 while the second electrode may be a top electrode 166. In one embodiment, the device 200 differs from the device 100 in that the encapsulation liner is provided in the form of vertical dielectric spacers 287. As shown in FIGS. 2a-2b, the encapsulation liner in the form of vertical dielectric spacers 287 cover or line exposed side surfaces of the MTJ stack and top electrode without lining the top surface of the second upper dielectric layer 150. Furthermore, similar to the encapsulation liner 182 of FIGS. 1a-1b, the encapsulation liner in the form of vertical dielectric spacers 287 also includes a top surface which extends beyond a bottom surface of the via contact 184 to cater for the CD and overlay variation and to ensure a full landing process.

FIGS. 3a-3i show simplified cross-sectional views of a process 300 for forming an embodiment of a device. The cross-sectional views of the process 300 are taken along first (or logic) region 110a, second (or memory) region 110b and third (or scribe) region 110c of the device. In one embodiment, the process allows a memory cell to be formed with logic components on the same substrate using logic processing. The process 300 which forms the memory cell together with the logic components are generally based on any suitable technology node (including but not limited to 28 nm technology node) where low-k dielectric layers are used in back-end-of-line (BEOL) processing. The memory cell, for example, may be a MRAM cell. The MRAM, in one embodiment, is a STT-MRAM cell. The device formed, for example, is similar or the same as that shown and described in FIGS. 1a-1b. As such, common elements may not be described or described in detail.

For simplicity, the processing of a substrate to form transistors using FEOL and processing of lower ILD level and lower levels of an upper ILD level using BEOL are not shown. Referring to FIG. 3a, the process 300 is at the stage of providing a dielectric layer 120 over a substrate (not shown). The dielectric layer 120, for example, may correspond to upper ILD level 5 having via level V4 and metal level M5. For the sake of simplicity and for illustration purpose, the dielectric layer 120 may be referred to as a first upper dielectric layer and its via and metal levels may be referred to as a first upper interconnect level. The dielectric layer 120 is formed of a low-k dielectric material. Preferably, the dielectric layer 120 includes an ultra low-k dielectric layer, such as SiCOH. Other suitable low-k dielectric materials may also be useful.

The process includes forming suitable via openings (not shown) and trenches in the first (or logic) region 110a and second (or memory) region 110b. Trenches 335 are formed in the first upper dielectric layer 120 of the first and second regions 110a and 110b. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed.

In one embodiment, the trenches 335 in the first and second regions are formed simultaneously. The trenches, for example, include the same depth dimension defined by, for example, 1× design rule. The depth of the trenches, for example, may be about 850-1000 Å with reference to the top surface of the first upper dielectric layer based on 28 nm technology node. Other suitable depth dimensions may also be useful, depending on design requirement of a technology node.

The process continues by depositing a conductive layer on top of the first upper dielectric layer and fills the trenches. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The trenches filled with conductive material form metal lines 135 in the first and second regions. Although one metal line is shown in the first and second regions, it is understood that there could be more than one metal line being formed in the same metal level of the first and second regions. The metal line 135 in the first region may correspond to an interconnect in a metal level while the metal line 135 in the second region may be coupled to a MTJ element which will be formed in subsequent processing. As shown, the process forms metal lines 135 in the first and second regions simultaneously in a metal level (e.g., M5) of the device.

Referring to FIG. 3a, a dielectric liner 140 is formed above the first upper dielectric layer covering the metal lines 135 in the first and second regions. The dielectric liner, for example, serves as an etch stop layer. The dielectric liner may be a low k dielectric liner. For example, the dielectric liner may be NBLoK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 150. As shown in FIG. 3a, the second upper dielectric layer 150 is formed on the first upper dielectric layer. For example, the second upper dielectric layer is formed on the dielectric liner 140. The second upper dielectric layer, in one embodiment, includes a low-k dielectric material. Preferably, the second upper dielectric layer 150 is formed of a low-k dielectric layer, such as SiCOH. The second upper dielectric layer may be formed by CVD. Any other suitable forming techniques or suitable low-k materials and thicknesses for the second upper dielectric layer may also be useful.

Figure 3B:
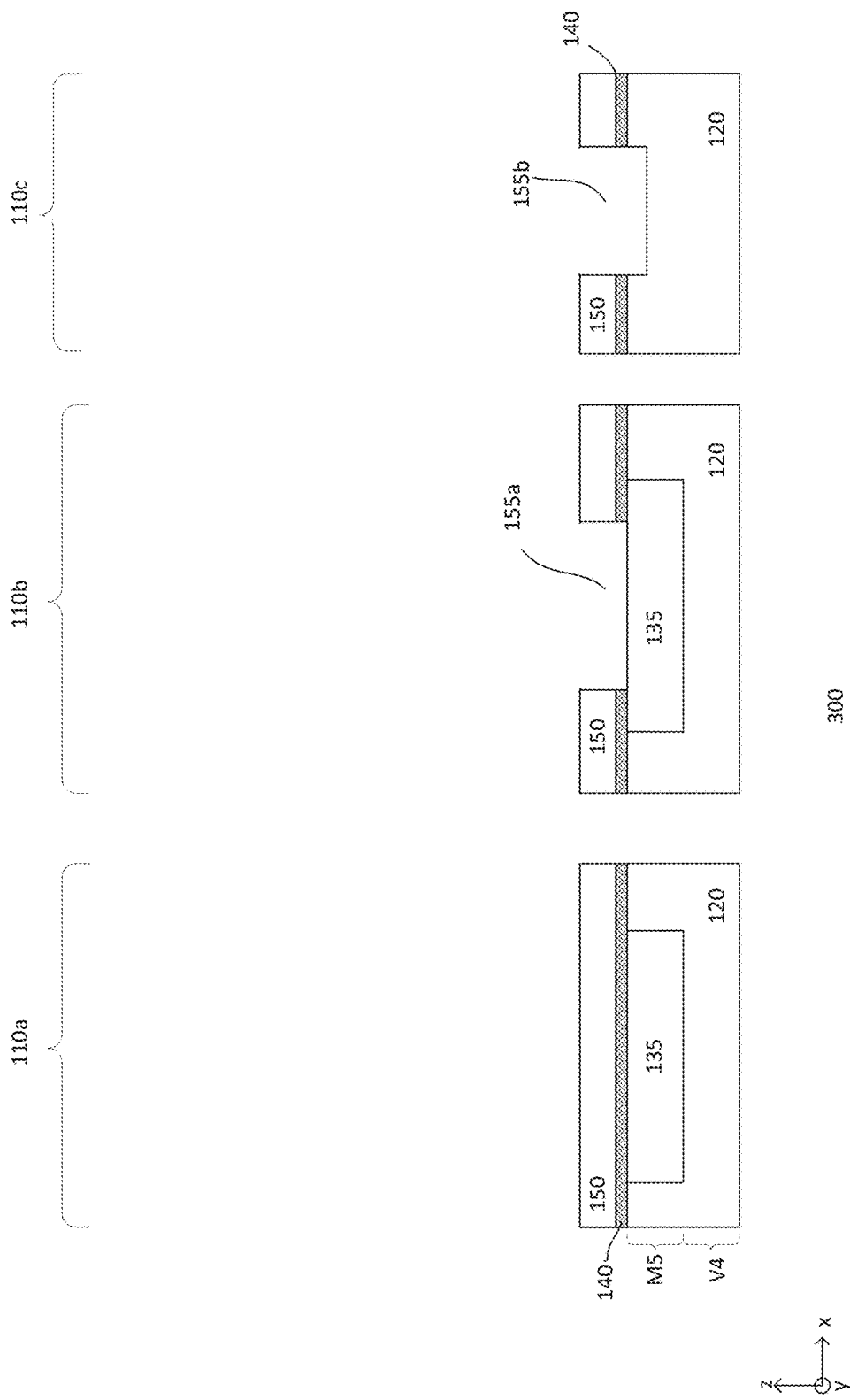

In FIG. 3b, the second upper dielectric layer 150 and the dielectric liner 140 in the second (or memory) region 110b and third (or scribe) region 110c are patterned to form trench openings 155a-155b. In one embodiment, the opening 155a in the second region includes sufficient depth to accommodate a bottom electrode which will be coupled to the MTJ element of the memory cell while the opening 155b in the third region includes sufficient depth to serve as an alignment trench which provides adequate topography which is used for aligning and defining subsequently formed layers of the MTJ element. The alignment trench 155b, in one embodiment, is formed simultaneously with the opening 155a which accommodates the bottom electrode. Although a single opening is shown corresponding to an alignment trench in the third region, the alignment trench may include a plurality of groups and subgroup of alignment trenches. The trenches may be rectangular or square shape or may include other suitable shapes. The trenches may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to form the trenches 155a-155b. As shown, the etch stops when it reaches a top surface of the metal line 135 in the second region while the etch forms the alignment trench 155b which has a depth slightly deeper than the trench opening 155a. For example, the depth of the alignment trench 155b may be about 800 Å. Other suitable depth dimensions may also be useful. The metal line 135 in the second region, for example, serves as an etch stop for the trench opening 155a.

Figure 3C:
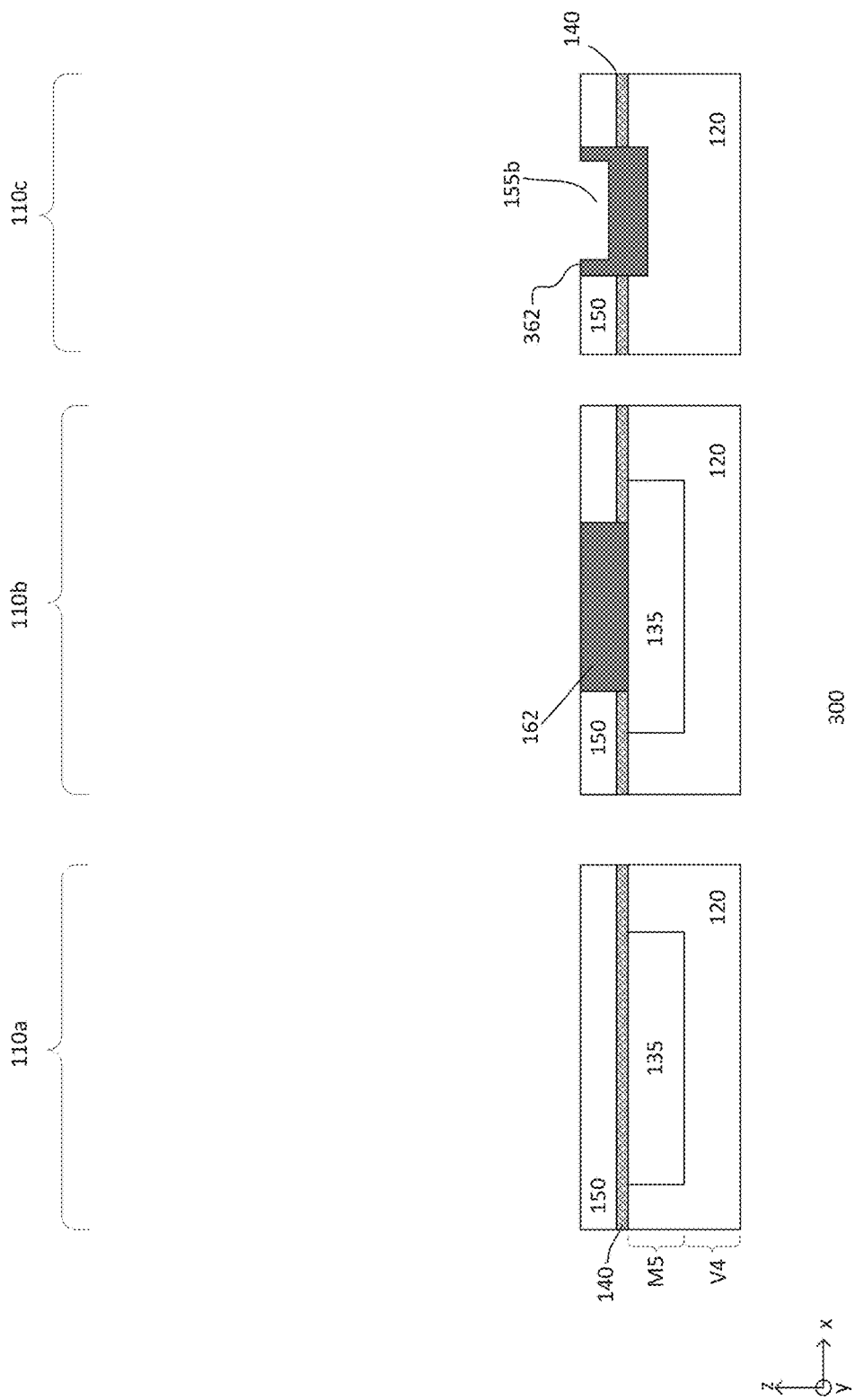

The process continues by depositing a conductive layer 362 over the first, second and third regions. For example, the conductive layer is conformally formed over a top surface of the second upper dielectric layer in the first, second and third regions and fills the trench openings 155a-155b in the second and third regions. The conductive layer, for example, may include Ti, TiN, Ta or TaN and may be formed by physical vapor deposition (PVD). Other suitable conductive materials and deposition techniques may also be employed. A CMP process is performed to remove excess conductive material on top of the second upper dielectric layer and to provide a substantially planar top surface. As shown in FIG. 3c, the CMP process removes the conductive layer over the first region and defines the bottom electrode 162 in the second region while a portion of the conductive layer 362 remains in the alignment trench 155b. As shown in FIG. 3c, the profile of the alignment trench is transferred to the surface of the portion of the conductive layer 362, creating adequate topography feature 155b in the third region which is visible from the top surface of the substrate. The topography feature may be used as an alignment mark during patterning to define layers of MTJ stack of the MRAM cell later. The presence of such topography feature in the third region avoids the use of an additional alignment mask.

Figure 3D:
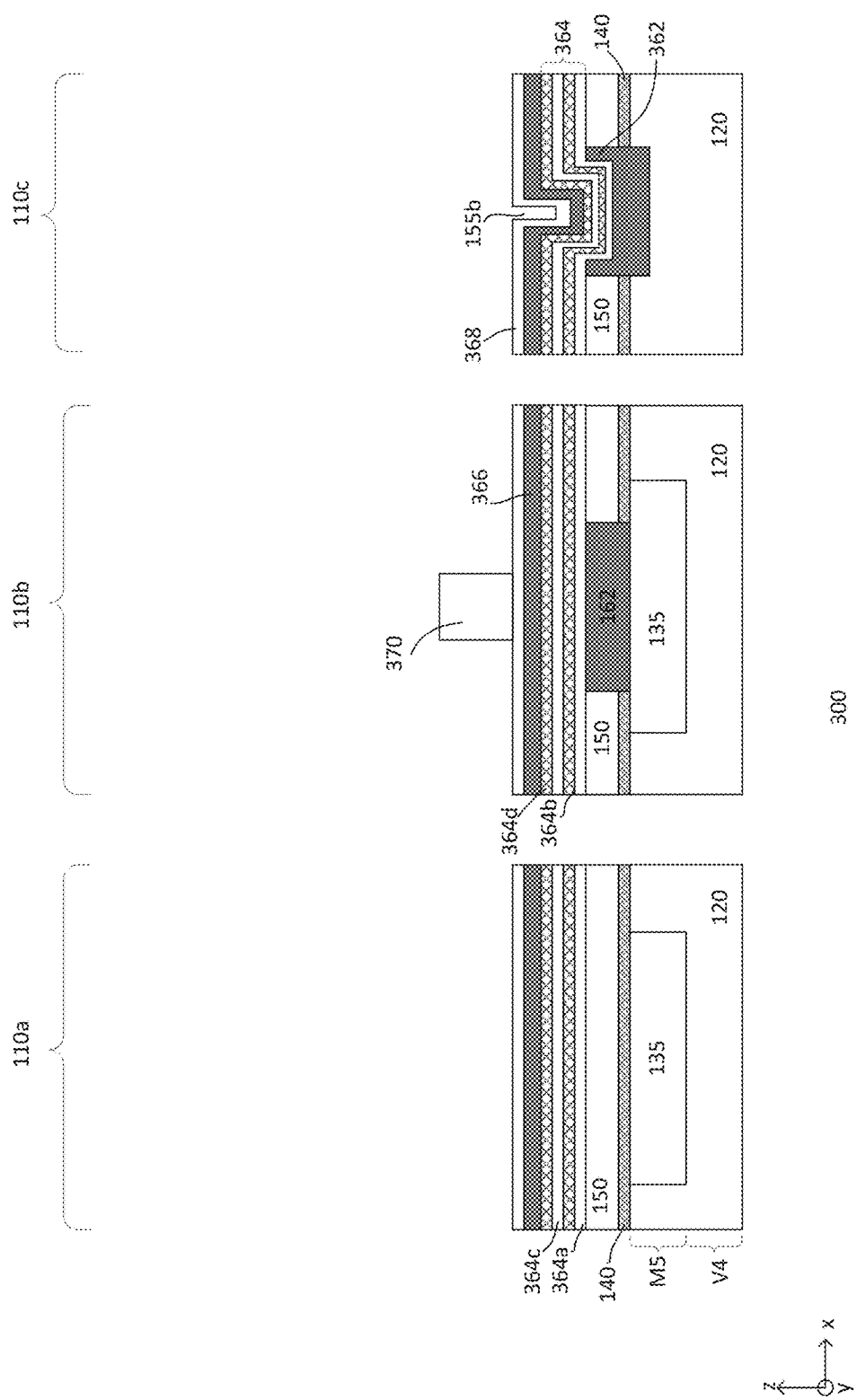

The process continues to form MTJ stack of the MRAM cell. Various layers of the MTJ stack are formed on the second upper dielectric layer 150 as shown in FIG. 3d. For example, various layers of the MTJ stack of the MRAM cell are sequentially formed over the second upper dielectric layer in the first, second and third regions. The process forms various layers of the MTJ stack 364, a top electrode layer 366 and a hard mask layer 368 over the second upper dielectric layer 150 by PVD process. As shown in FIG. 3d, the various layers of the MTJ stack are conformally formed and follow the profile of the underlying bottom electrode layer 362 in the alignment trench. Other suitable techniques may also be used. The MTJ stack, for example, is shown to include four layers 364a-364d having materials the same as that described in FIGS. 1a-1b. It is understood that the MTJ stack may include other suitable number of layers and other suitable materials. The top electrode layer 366, for example, may include the same material as the bottom electrode while the hard mask layer 368, for example, includes an oxide material.

The process continues to pattern the top electrode layer and layers of the MTJ stack. Patterning the layers may be achieved with mask and etch techniques. A soft mask 370, such as a photoresist layer, is formed on the hard mask layer. The soft mask is patterned to form a pattern which is used to define the top electrode and MTJ layers. To form the pattern in the mask layer, it may be selectively exposed with an exposure source using a reticle (not shown). In one embodiment, the reticle (not shown) used to expose the resist mask is aligned using the alignment mark 155b, which is visible as topography even after the deposition of the top electrode and hard mask layers. The pattern of the reticle is transferred to the resist layer 370 after exposure by a development process.

Figure 3E:
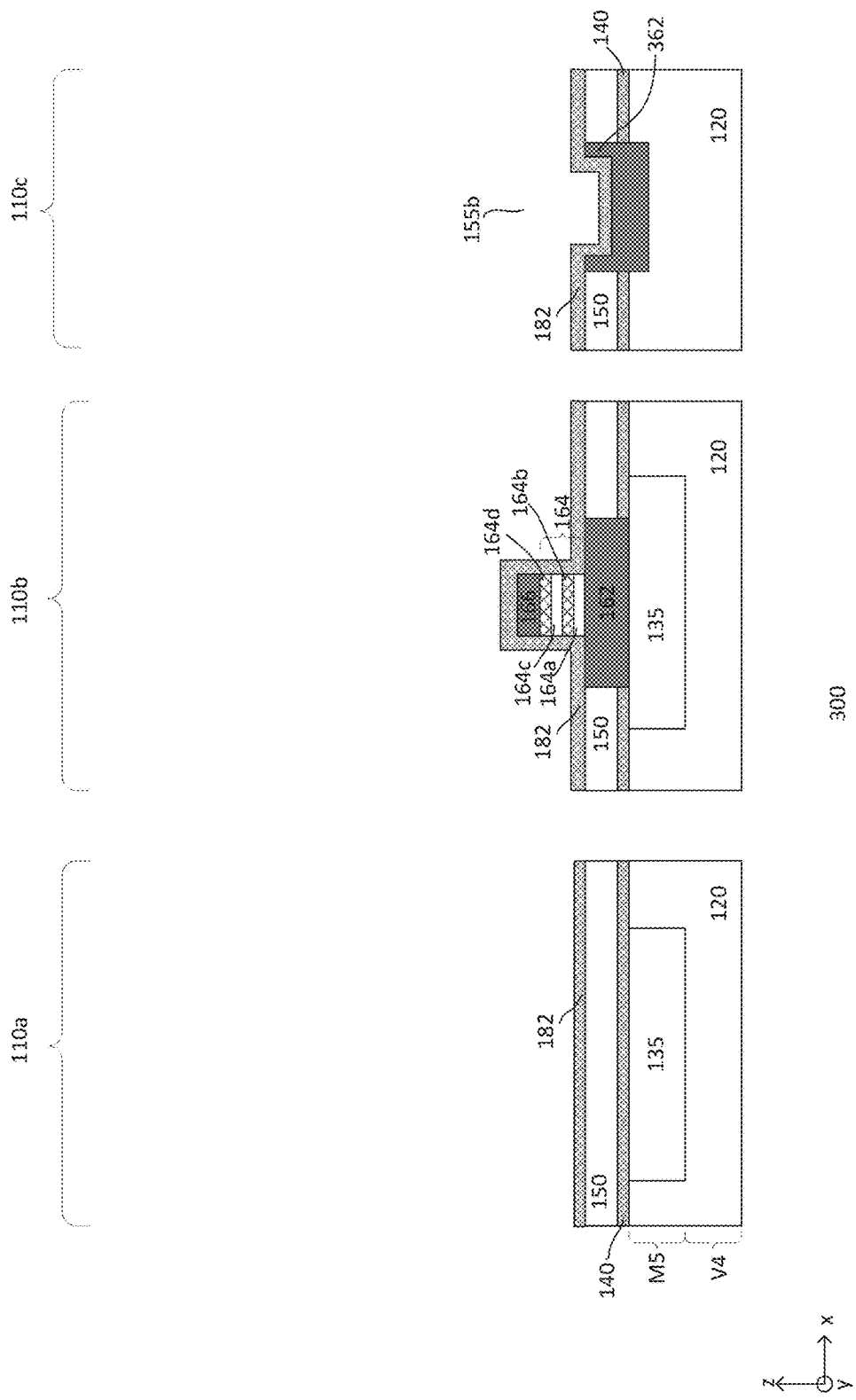

As shown in FIG. 3e, the patterned mask 370 is used to define the layers of the MTJ stack and top electrode 166 of the memory cell and hard mask 168 by removing portions of the layers of the MTJ stack, top electrode layer and hard mask layer not protected by the patterned mask in the first, second and third regions. As shown, the top electrode and layers of the MTJ stack are patterned in such a way that the patterned top electrode 166 and layers 164a-164d of the MTJ stack 164 are aligned and properly coupled to the bottom electrode in the second region using the topography which is present in the alignment trench 155b. Other suitable techniques for patterning the layers and to ensure that the top electrode and MTJ stack align and properly couple to the underlying bottom electrode 162 in the second region may also be useful. As shown in FIG. 3e, the hard mask layer, top electrode layer and layers of the MTJ stack are completely removed from the first and third regions. The patterned mask is removed using suitable techniques, such as ashing while the remaining hard mask over the MTJ stack in the second region is removed using suitable technique.

The process continues by depositing a dielectric liner 182 over the first, second and third regions as shown in FIG. 3e. The dielectric liner 182 covers exposed surfaces of the patterned top electrode and MTJ layers in the second region while covering top surface of the dielectric layer in the first and third regions as well as lining the alignment trench in the third region. The dielectric liner 182, for example, may be formed by CVD and serves as an etch stop layer or protective layer during subsequent processing. The dielectric liner may be a low k dielectric liner. For example, the dielectric liner may be silicon nitride. Other suitable types of dielectric materials for the dielectric liner and forming techniques may also be useful.

Figure 3F:
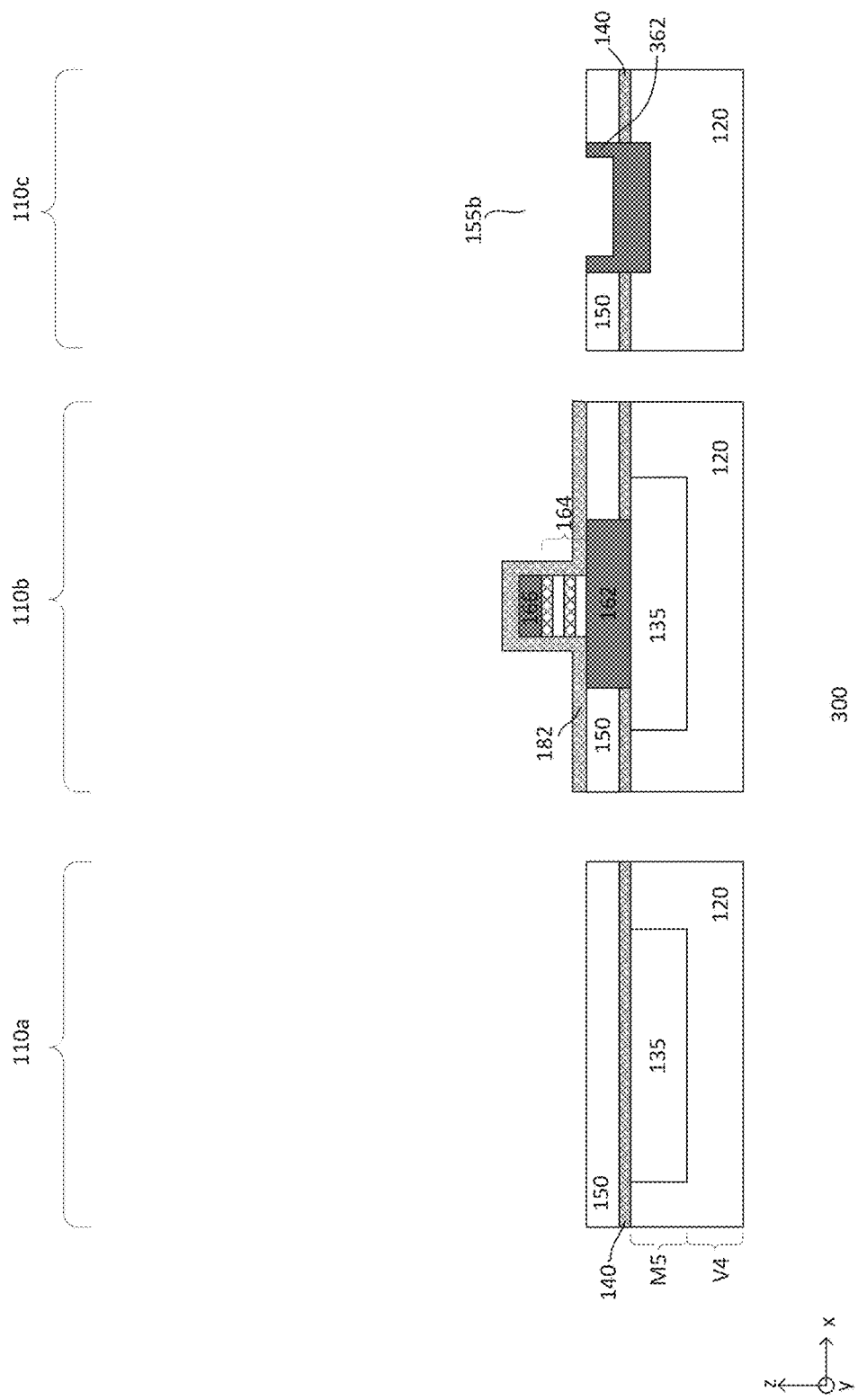

Referring to FIG. 3f, the process continues to process the dielectric liner 182. For example, the dielectric liner 182 is patterned to remove portions of the dielectric liner in the first and third regions. This may be achieved by providing a mask (not shown) over the second region to protect the second region while the mask includes openings which expose the first and third regions and performing a removal process thereafter. Removal can be achieved, for example, using a blanket dry etch, such as RIE. Other suitable techniques may also be useful. The etch stops when it reaches the top surface of the second upper dielectric layer 150. As shown, exposed portions of the dielectric liner in the first and third regions not protect by the mask are removed while the dielectric liner 182 which remains in the second region serves as an encapsulation liner. As shown, the encapsulation liner 182 covers exposed surfaces of the second upper dielectric layer 150, bottom electrode 162, MTJ stack 164 and top electrode 166.

Figure 3G:
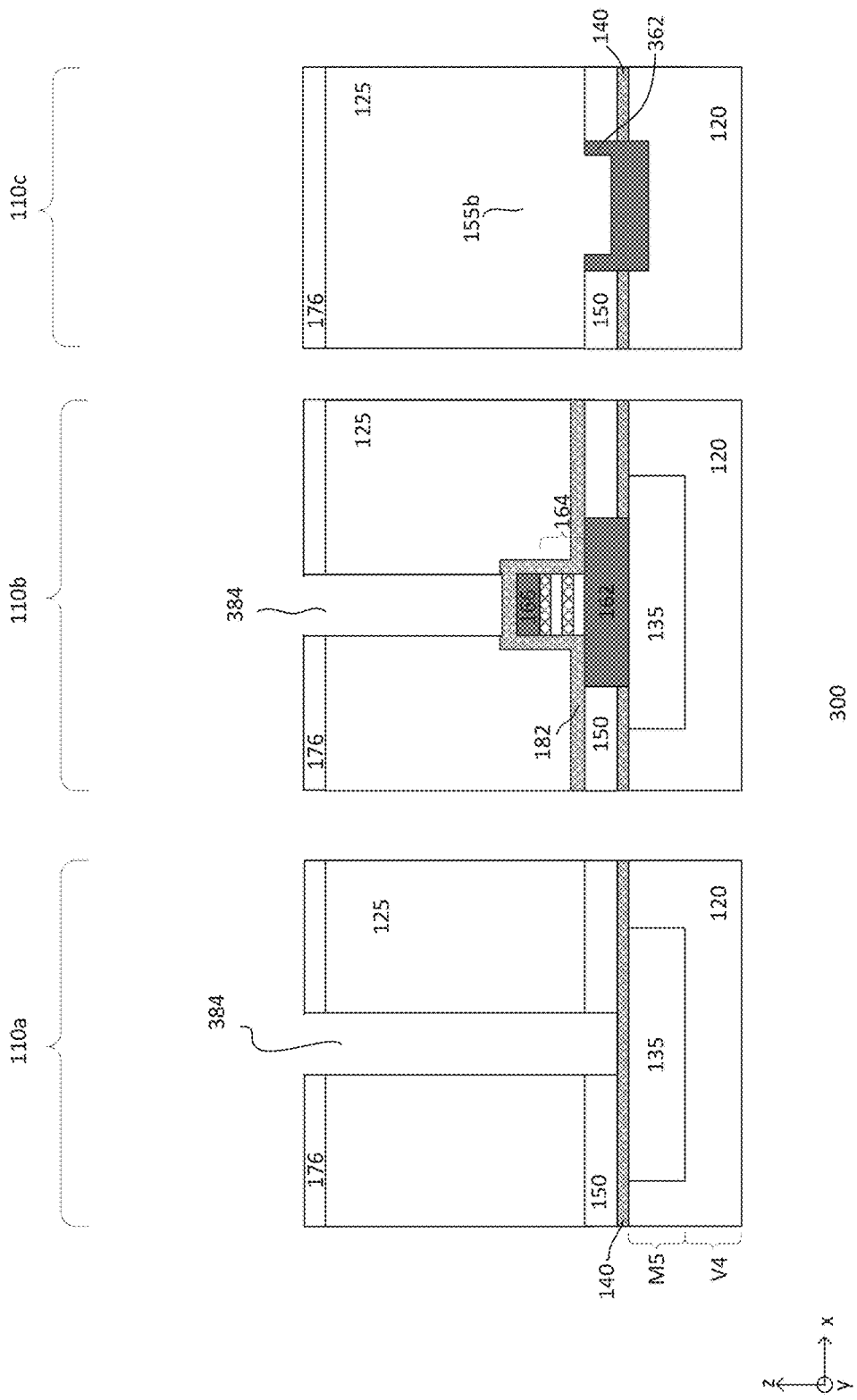

A third upper dielectric layer 125 and a hard mask layer 176 are formed. The third upper dielectric layer is formed over the dielectric liner 182 in the second region and over the dielectric layer 150 in the first and third regions while the hard mask layer 176 is formed over the third upper dielectric layer as shown in FIG. 3g. The third upper dielectric layer, for example, includes a low-k dielectric material which is the same material as the second upper dielectric layer and the hard mask layer includes an oxide material. The third upper dielectric layer and the hard mask layer may be formed by CVD and the third upper dielectric layer includes a thickness sufficient to cover the patterned MTJ stack 164 and top electrode 166 in the second region as well as sufficient to accommodate interconnect (metal line and via contact) in an ILD level (e.g., ILD level 6 having metal level M6 and via level V5) in the first region. Other suitable dielectric materials and techniques may be used for forming the third upper dielectric and hard mask layers. A planarization process is performed to remove excess third upper dielectric layer 125. The planarization process, for example, may be achieved by CMP. Other suitable techniques may also be useful. The planarization process produces a substantially planar top surface. The third upper dielectric layer 125, for example, may correspond to upper ILD level 6.

In one embodiment, the process continues to form dual damascene opening having a trench and a via opening in the dielectric layer 125 in the first region and a dual damascene opening having a trench and a via opening in the second region. The dual damascene opening may be formed by via first or via last process. Referring to FIG. 3g, the hard mask 176 and the third upper dielectric layer 125 are patterned to form via openings 384 in the first and second regions simultaneously. The via openings, in one embodiment, may be defined taken into consideration the critical dimension (CD) of the top CD of the MTJ stack and thickness of vertical portions of the dielectric liner 182 surrounding the top and side surfaces of the MTJ stack so that the via contact formed in the via opening is fully landed on top of the MTJ stack. For example, the bottom CD of the via opening may be the same or smaller than top CD of the MTJ stack. Depending on the thickness of the vertical portions of the dielectric liner and CD/overlay tolerance, if the dielectric liner is sufficiently thick, the bottom CD of the via opening may be slightly larger than the top CD of the MTJ stack.

The via openings 384 may be formed by mask and etch techniques. For example, a mask (not shown), such as photoresist, may be used to serve as an etch mask to pattern the hard mask 176 and third upper dielectric layer 125 to form the via openings in the first and second regions. A first etch, for example, which is highly selective to the material of the third upper dielectric layer is employed to remove exposed portions of the third upper dielectric layer to form the via openings. In one embodiment, the first etch simultaneously removes the exposed portion of the third upper dielectric layer to forms via openings 384 in the first and second regions. As shown, the first etch forms the via opening 384 in the second region and stops when it reaches the dielectric liner 182 while the first etch continues to remove dielectric materials to form the via opening 384 in the first region and stops when it reaches the dielectric liner 140. In this case, the dielectric liner 182 protects the top electrode 166 in the second region from being consumed while the first etch continues to form via opening in the first region. The via opening 384 in the first region, for example, includes a depth or height which is greater than a depth of the via opening 384 in the second region. Other suitable depth dimensions may also be useful. Since the first etch is highly selective to the material of the dielectric layer, the first etch, for example, stops when it reaches top surface of the dielectric liners 182 and 140. In other embodiments, the etch may slightly consume the dielectric liner 182.

Figure 3H:
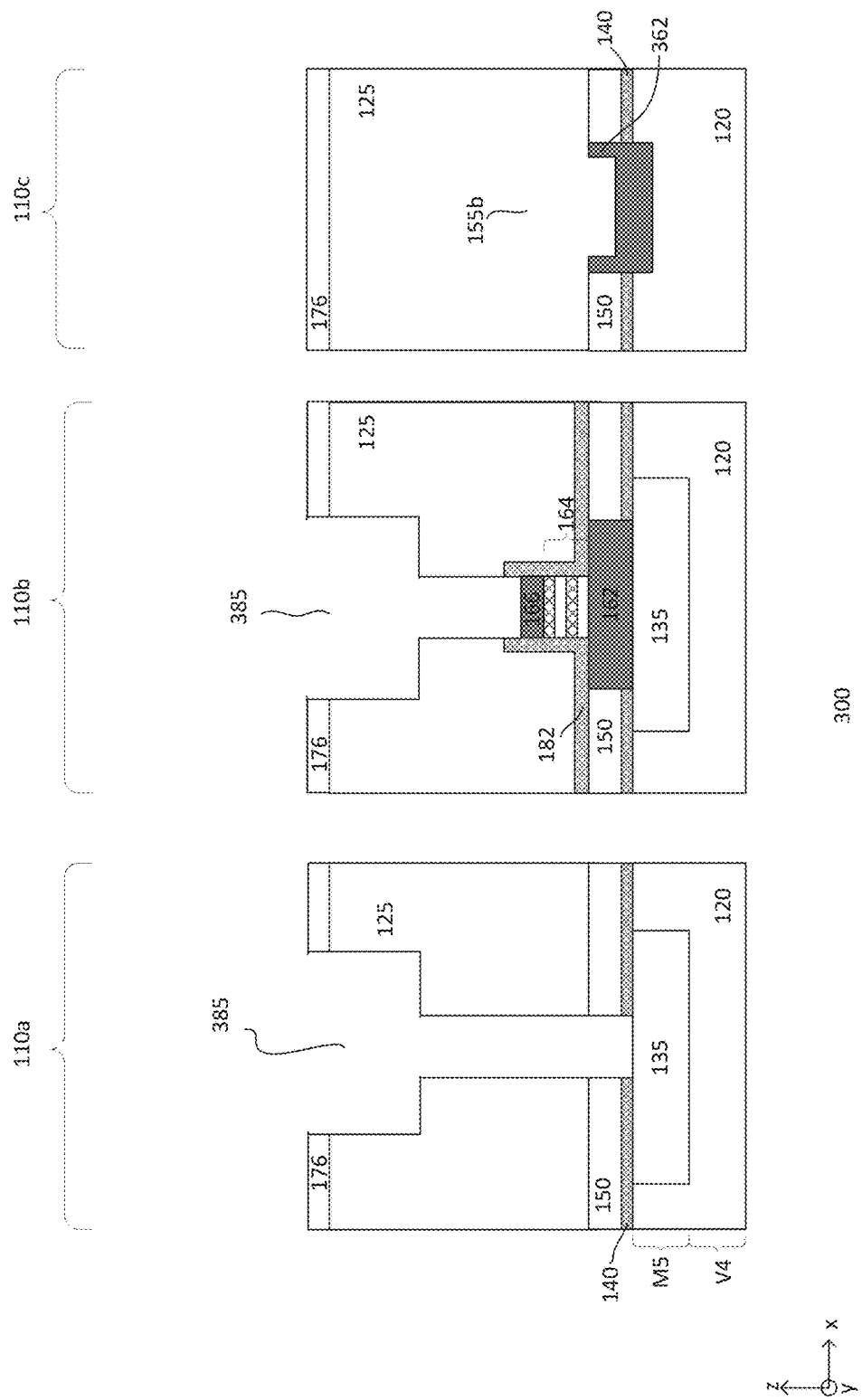

Referring to FIG. 3h, the hard mask and the third upper dielectric layer are patterned to form trenches 385 in the first and second regions simultaneously. The trenches may be formed by mask and etch techniques. For example, a mask (not shown), such as photoresist, may be used to serve as an etch mask to pattern the hard mask and third upper dielectric layer to form the trenches. To form the trenches, a second etch may be performed. The second etch, for example, may be a two-step etch process which can be performed in-situ. The first etch of the two-step etch process, for example, is highly selective to the material of the third upper dielectric layer and stops on top of the dielectric liners 182 and 140 while the second etch of the two-step etch process, for example, is highly selective to material of the dielectric liners and removes exposed portions of the dielectric liners 182 and 140. Thus, dual damascene openings are formed in the first and second regions as shown in FIG. 3h. As shown, the trench 385 in the first region is in communication with the via opening 384 which is in communication with metal line 135 while the trench 385 in the second region is in communication with the via opening 384 which is in communication with the top electrode 166 over the MTJ stack. The trenches 385, for example, may correspond to top metal line trenches having 2 times the depth of the trenches 335.

Referring to FIG. 3i, a conductive layer is formed. The conductive layer covers the third upper dielectric layer 125 as well as filling the trenches and via openings. For example, the conductive layer fills the dual damascene openings in the first and second regions. The conductive layer should be sufficiently thick to fill the trenches and via openings. In one embodiment, the conductive layer is a Cu layer. Other suitable types of conductive layers may also be useful. The conductive layer may be formed by, for example, ECP. Other suitable techniques for forming the conductive layer may also be useful.

Excess conductive material is removed by CMP, forming metal lines 185 and top via contacts 184 in the first and second regions as shown in FIG. 3i. As shown, the top surface of the metal lines is substantially planar with the top surface of the third upper dielectric layer 125. In one embodiment, the via contact 184 in the second region includes a bottom surface which is lower than a top surface of vertical portion of the dielectric liner 182 which surrounds the MTJ stack.

The process continues to complete formation of the IC. The process, for example, may continue to form passivation layer and pad interconnects or bonding pads. Further processing can include final passivation, dicing, assembly and packaging. Other processes are also useful.

Figure 4A:
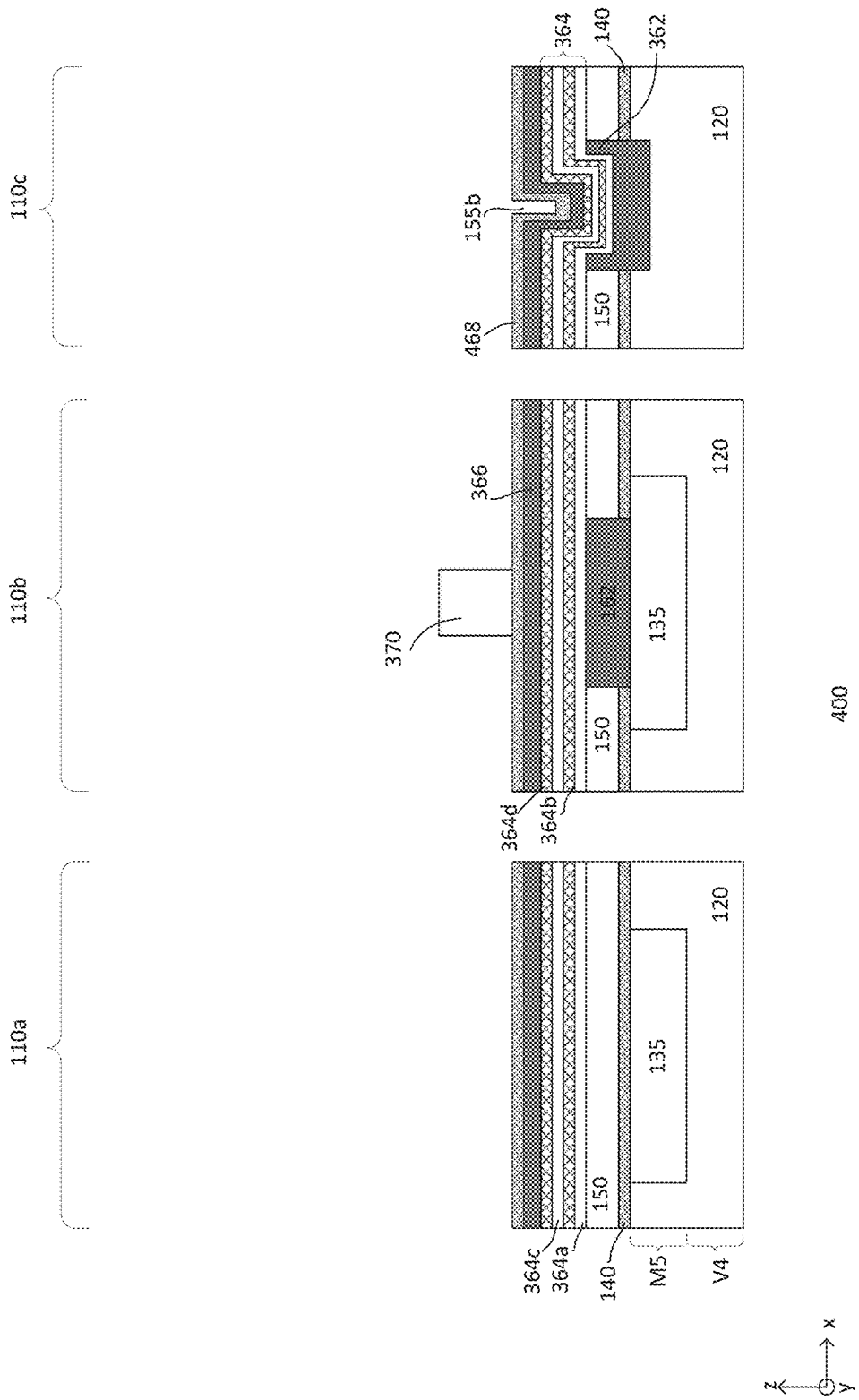

FIGS. 4a-4e show cross-sectional views of another embodiment of a process 400 for forming a device. The device formed by process 400 is the same or similar to the device 200 as described in FIGS. 2a-2b and the process 400 may contain similar steps as that described in FIGS. 3a-3i. In the interest of brevity, common elements may not be described or described in detail. As shown in FIG. 4a, the partially processed substrate is at the stage similar to that described in FIG. 3d. For example, various layers 364a-364d of the MTJ stack 364 are formed over the second upper dielectric layer 150 and lines the alignment trench 155b in the third region.

In one embodiment, after depositing the top electrode layer 366, the process 400 continues to form a dielectric liner 468 over the top electrode layer 366. The dielectric liner 468 may include the same material and may be formed by the same technique as used for dielectric liner 182 described in FIG. 3e and may include sufficient thickness to serve as an etch stop layer and protective layer during subsequent processing.

The process continues to pattern the dielectric liner 468, top electrode layer and layers of the MTJ stack. Patterning the layers may be achieved with mask and etch techniques.

A soft mask 370, such as a photoresist layer, is formed on the dielectric liner 468. The soft mask is patterned to form a pattern which is used to define the top electrode and layers of the MTJ stack. To form the pattern in the mask layer, it may be selectively exposed with an exposure source using a reticle (not shown). In one embodiment, the reticle (not shown) used to expose the resist mask is aligned using the alignment mark 155b, which is visible as topography even after the deposition of the top electrode layer and dielectric liner. The pattern of the reticle is transferred to the resist layer 370 after exposure by a development process.

Figure 4B:
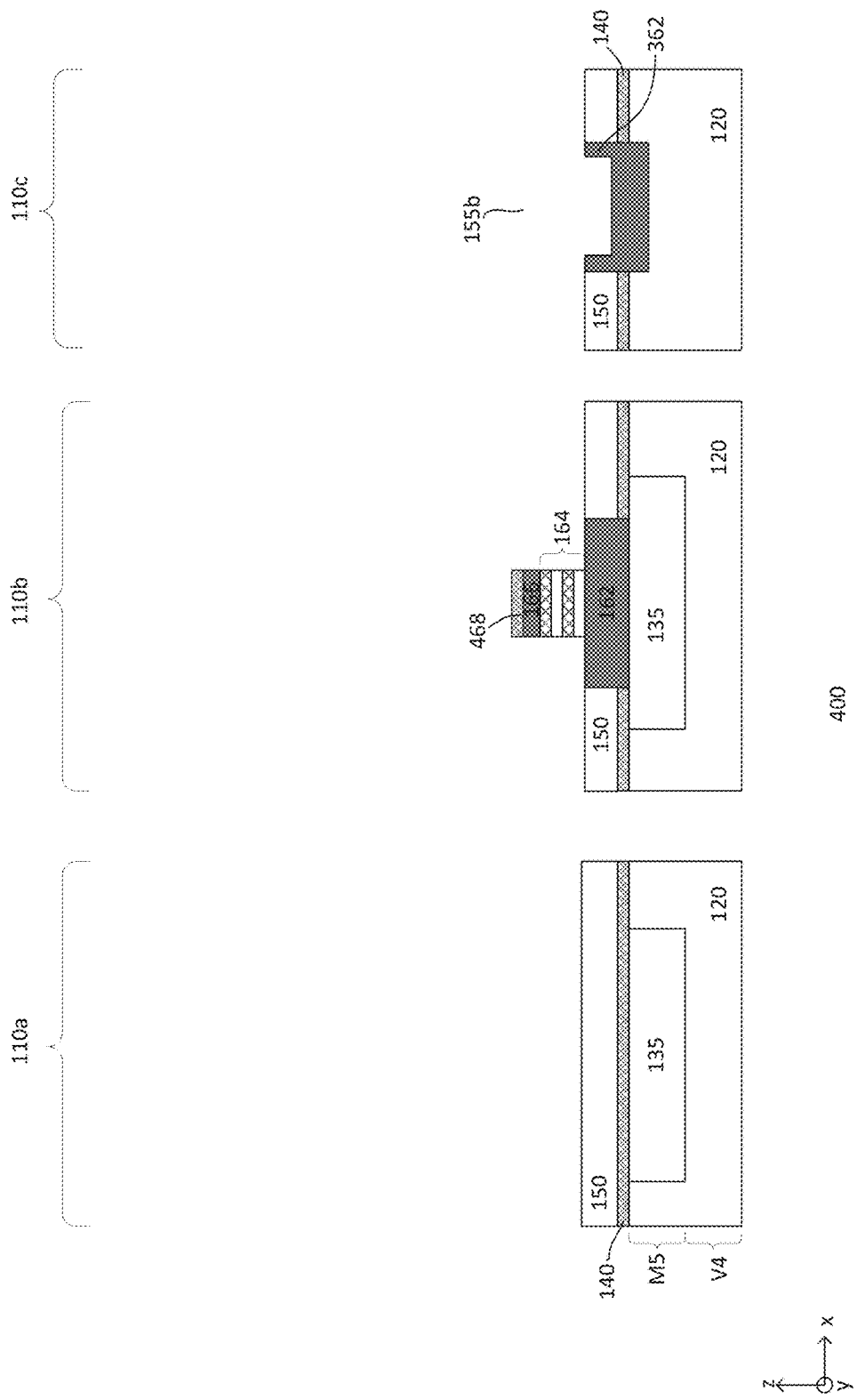

As shown in FIG. 4a, the patterned mask 370 is used to define the dielectric liner 468, top electrode and layers of the MTJ stack of the memory cell by removing portions of the layers of the MTJ stack, top electrode layer and dielectric liner 468 not protected by the patterned mask in the first, second and third regions. As shown, the dielectric liner, top electrode and layers of the MTJ stack are patterned in such a way that the patterned dielectric liner 468, top electrode 166 and the layers of the MTJ stack 164 are aligned and properly coupled to the bottom electrode in the second region using the topography which is present in the alignment trench 155b. Other suitable techniques for patterning the layers and to ensure that the top electrode and MTJ stack align and properly couple to the underlying bottom electrode 162 in the second region may also be useful. As shown in FIG. 4b, the dielectric liner 468, top electrode layer 366 and layers of the MTJ stack 364 are completely removed from the first and third regions. The patterned mask is removed using suitable techniques, such as ashing. As shown, the patterned dielectric liner 468 remains over the top electrode 166 in the second region. The remaining dielectric liner 468, for example, may have a thickness which is the same or larger than thickness of the dielectric liner 140.

The process continues by depositing an additional dielectric liner over the first, second and third regions. The dielectric liner covers exposed surfaces of the top electrode and patterned MTJ layers in the second region while covering top surface of the second upper dielectric layer in the first and third regions as well as lining the alignment trench in the third region. The dielectric liner, for example, may be formed by in-situ or ex-situ deposition or CVD and may include the same material as dielectric liner 468. Other suitable types of dielectric materials for the dielectric liner and forming techniques may also be useful. In one embodiment, a blanket etch process is performed to remove horizontal portions of the additional dielectric liner in the first, second and third regions, leaving vertical portions in the form of dielectric spacers 287 lining sidewalls of the patterned top electrode and layers of the MTJ stack in the second region as shown in FIG. 4c. As shown, the patterned top electrode and layers of the MTJ stack are encapsulated with dielectric liners, such as dielectric liner 468 over the top surface and dielectric spacers 287 on the sidewalls.

Figure 4D:
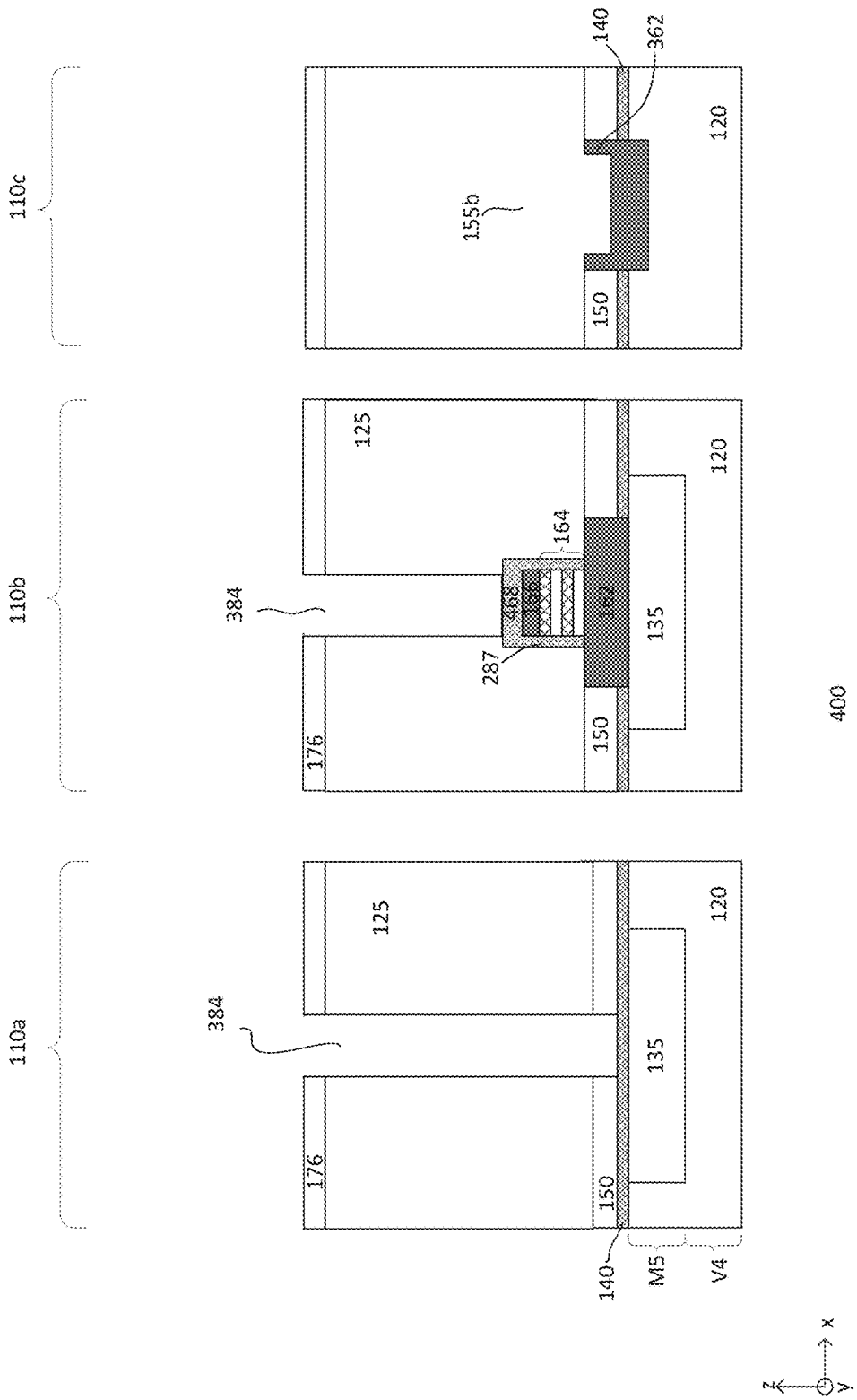
Figure 4E:
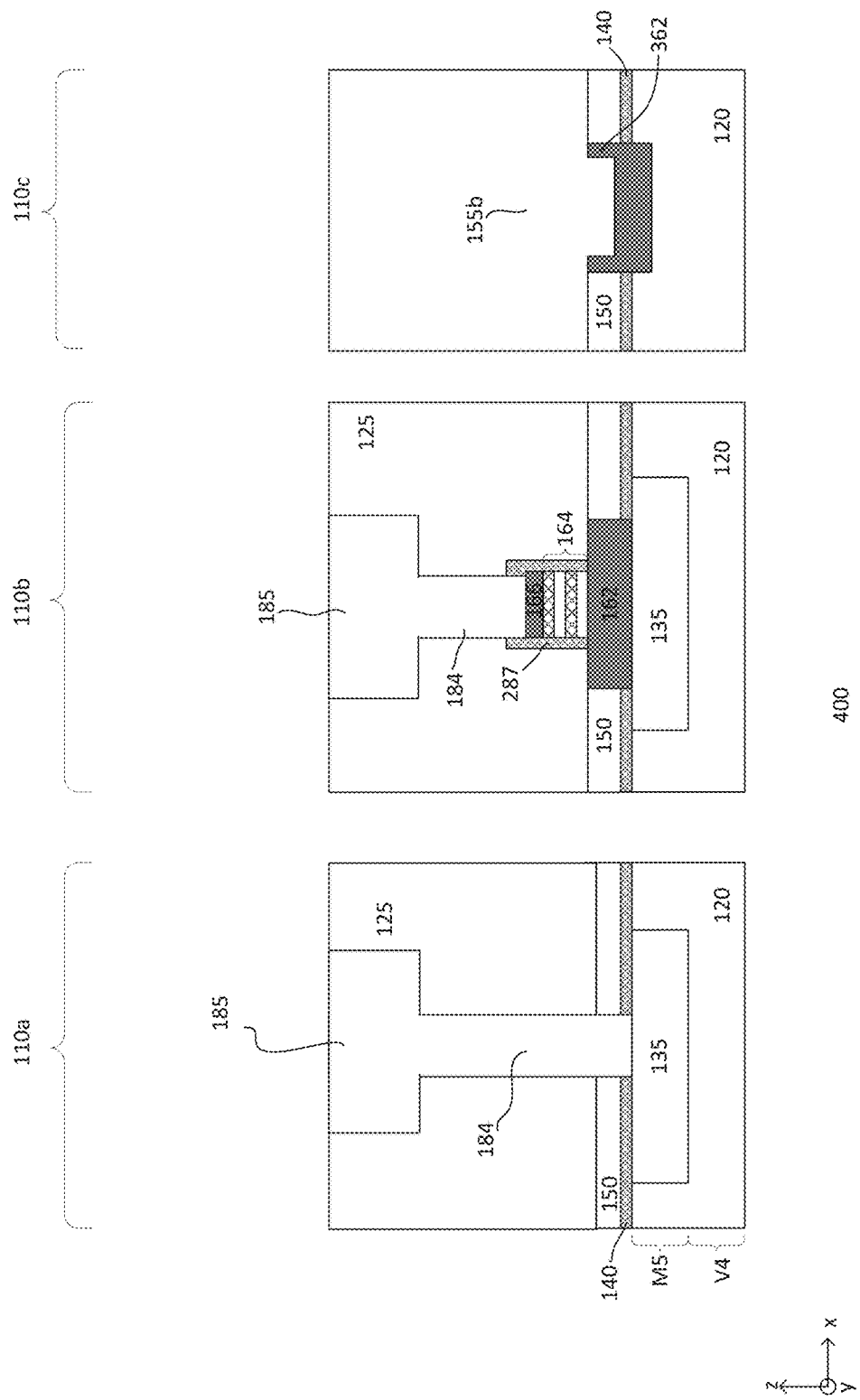

The process 400 continues to form a third upper dielectric layer 125 and a hard mask layer 176 as shown in FIG. 4d. Materials and techniques for forming the third upper dielectric layer and hard mask layer are the same as that described in FIG. 3g. After forming the third upper dielectric layer, the process continues to form dual damascene opening having a trench and a via opening in the dielectric layer 125 in the first region and a dual damascene opening having a trench and a via opening in the second region. Techniques to form the dual damascene openings in the first and second regions are the same as that described in FIGS. 3g and 3h. For example, the etch to define the via openings are highly selective to materials of the dielectric layer 125 and stops when it reaches top surface of the dielectric liner 468 in the second region and dielectric liner 140. A two-step etch process is then performed to define the trenches and to remove exposed portions of the dielectric liners 468 and 140. A conductive layer is provided to fill the trenches and via openings. Excess conductive material is removed by CMP, forming metal lines 185 and top via contacts 184 in the first and second regions as shown in FIG. 4e. Techniques to provide the conductive material and to remove excess conductive material to form metal lines 185 and via contacts 184 are the same as that described in FIG. 3i. As shown in FIG. 4e, the top surface of the metal lines is substantially planar with the top surface of the third upper dielectric layer 125. In one embodiment, the via contact 184 in the second region includes a bottom surface which is lower than a top surface of the encapsulation liner which is in the form of dielectric spacers 287 which surrounds the MTJ stack.

The process continues to complete formation of the IC. The process, for example, may continue to form passivation layer and pad interconnects or bonding pads. Further processing can include final passivation, dicing, assembly and packaging. Other processes are also useful.

As described, the device includes one memory cell. However, it is understood that a device may include numerous memory cells integrated into the same IC. Further, although the two-terminal device element as described in the present disclosure refers to the MTJ storage element of a MRAM cell, it is understood that other suitable two-terminal device elements may also be integrated with the logic circuit component using the techniques and processes as described herein. In addition, although the two-terminal device element is disposed in specified ILD level of the back end dielectric layer, other configurations may also be useful. For example, the two-terminal device element may be disposed in other suitable ILD level.

The embodiments as described in the present disclosure result in various advantages. The process as described is highly compatible with logic processing or technology. For example, the two-terminal device element such as the MTJ element is formed concurrently on the same substrate using logic processing without compromising the reliabilities of the memory cell and other components in the logic region on the same substrate. Moreover, the process as described is useful for integrating MTJ element of an MRAM cell with logic components in BEOL layers with minimal number of masks. For example, the mask used for defining the via opening for logic component in the logic region may also be used for defining via opening in the memory region. The via contact which provides electrical connection to the MTJ element is formed simultaneously with the via contact of the logic region of the same ILD level. Furthermore, the height of the via contact formed in the memory region can be made flexible and compatible with any suitable desired or required via height of the via contact in the logic region of the same ILD level. This, for example, eliminates the need to introduce an additional top electrode module of conventional process which is used to match the via height of the via contact in the logic region. Thus, the process as described lowers the manufacturing costs compared to conventional processes and avoids investment of new tools and reduces the number of masks involved for integrating two-terminal device elements with logic components. As illustrated, the MTJ element is formed in between adjacent upper metal levels, such as in the via level between metal levels M5 and M6. The embodiments as described in this disclosure are flexible as the MTJ element of the MRAM cell may be disposed in between metal levels M3 and M4 or in between any other suitable adjacent metal levels where the total height of the two-terminal device element is less than the height of the via contact in the logic region of the same ILD level.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device, comprising:
   providing a substrate defined with at least first and second regions;
   providing a first dielectric layer over the first and second regions of the substrate, wherein the first dielectric layer comprises a first interconnect level;
   forming an etch stop layer over the first region and the second region, wherein the etch stop layer covers the first dielectric layer;
   patterning the etch stop layer to form a trench opening in the second region, wherein the trench opening extends from a top surface of the etch stop layer to a top surface of a metal line of the first dielectric layer in the second region;
   forming a bottom electrode in the second region over the first dielectric layer, wherein the bottom electrode is in direct contact with the metal line in the first interconnect level of the second region;
   forming a device layer on the bottom electrode;
   forming a top electrode layer on a top surface of the device layer;
   patterning the device layer and the top electrode layer to respectively form a device stack of a two-terminal device element and a top electrode, wherein the two-terminal device element is disposed over the bottom electrode, and the bottom electrode extends beyond sidewalls of the device stack;
   forming an encapsulation liner over the first region and the second region, wherein the encapsulation liner covers exposed side surfaces of the device layer of the two-terminal device element; and
   providing a second dielectric layer over the first and second regions and covering the first dielectric layer, wherein the second dielectric layer comprises a second interconnect level with a first dual damascene interconnect in the first region and a second dual damascene interconnect in the second region, the first dual damascene interconnect in the first region is formed over and is coupled to the metal line of the first dielectric layer in the first region, and the second dual damascene interconnect in the second region is coupled to the top electrode of the two-terminal device element.

2. The method of claim 1 wherein the encapsulation liner covers the top electrode of the two-terminal device element around the second dual damascene interconnect in the second region.

3. The method of claim 1 wherein the first region is a logic region for accommodating at least one logic component, the second region is a memory cell region for accommodating a magnetic random access memory (MRAM) cell, the two-terminal device element comprises a storage element of the MRAM cell, and the device layer comprises a magnetic tunneling junction element.

4. The method of claim 1 wherein the first and second dielectric layers comprise low-k dielectric layers.

5. The method of claim 1 comprising:
   forming a bottom electrode layer in the second region over the first dielectric layer and filling the trench opening; and
   performing a planarization process to remove excess bottom electrode layer to define the bottom electrode in the second region.

6. The method of claim 1 wherein the device layer includes magnetic tunneling junction layers, the two-terminal device element is a magnetic tunneling junction element, and the device stack is a magnetic tunneling junction stack.

7. The method of claim 1 wherein patterning the device layer and the top electrode layer to respectively form the device stack of the two-terminal device element and the top electrode comprises:
   providing a mask over the top electrode layer; and
   performing an etch process to remove exposed portions of the top electrode layer and the device layer not protected by the mask in the first and second regions.

8. A method of forming a device, comprising:
   providing a substrate defined with at least first and second regions;
   providing a first dielectric layer over the first and second regions of the substrate, wherein the first dielectric layer comprises a first interconnect level;
   forming a bottom electrode in the second region over the first dielectric layer, wherein the bottom electrode in direct contact with a metal line in the first interconnect level of the second region;
   forming a device layer on the bottom electrode;
   forming a top electrode layer on a top surface of the device layer;
   patterning the device layer and the top electrode layer to respectively form a device stack of a two-terminal device element and a top electrode, wherein the two-terminal device element is disposed over the bottom electrode;
   providing a second dielectric layer over the first and second regions and covering the first dielectric layer, wherein the second dielectric layer comprises a second interconnect level with a first dual damascene interconnect in the first region and a second dual damascene interconnect in the second region, the first dual damascene interconnect in the first region is formed over and is coupled to the metal line of the first dielectric layer in the first region, and the second dual damascene interconnect in the second region is coupled to the top electrode of the two-terminal device element;
   forming an encapsulation liner over the first region and the second region, wherein the encapsulation liner lines the second dielectric layer, the bottom electrode layer, and sides and a top of the two-terminal device element; and
   removing portions of the encapsulation liner over the first region and the second region while leaving the encapsulation liner lining the sides and the top of the two-terminal device element.

9. The method of claim 7 wherein forming the encapsulation liner comprises:
   forming a blanket encapsulation liner over the first and second regions, wherein the blanket encapsulation liner lines the second dielectric layer, the bottom electrode, and sides and a top of the device stack; and performing an etch process, the etch process removing portions of the blanket encapsulation liner over the first region while leaving the encapsulation liner in the second region.

10. The method of claim 1 comprising:
forming a third dielectric layer covering the second dielectric layer and the encapsulation liner which covers at least exposed sides and the top surface of the two-terminal device element; and
wherein the first dual damascene interconnect and the second dual damascene interconnect are formed by performing a first dual damascene etch to define via openings in the first and second regions, wherein the first dual damascene etch stops at the etch stop layer in the first region and at the encapsulation liner on the top surface of the two-terminal device element in the second region.

11. The method of claim 10 wherein the first dual damascene interconnect and the second dual damascene interconnect are formed by further performing a second dual damascene etch, wherein the second dual damascene etch forms trenches in communication with the via openings and etches through the etch stop layer in the first region and through the encapsulation liner in the second region.

12. The method of claim 1 comprising:
forming magnetic tunneling junction layers over the first and second regions;
forming a hard mask layer over the magnetic tunneling junction layers in the first and second regions; and
patterning the hard mask layer, the top electrode layer and the magnetic tunneling junction layers using a patterned soft mask.

13. The method of claim 1 wherein the encapsulation liner covers a top surface of the two-terminal device element.

14. The method of claim 1 wherein the bottom electrode is disposed in a third dielectric layer, the third dielectric layer and the bottom electrode have coplanar top surfaces, and the encapsulation liner lines sides and a top surface of the two-terminal device element and the top surface of the third dielectric layer in the second region.

* * * * *